US010210117B2

(12) United States Patent
Gittins

(10) Patent No.: US 10,210,117 B2
(45) Date of Patent: Feb. 19, 2019

(54) COMPUTING ARCHITECTURE WITH PERIPHERALS

(71) Applicant: Benjamin Aaron Gittins, Ta'Xbiex (MT)

(72) Inventor: Benjamin Aaron Gittins, Ta'Xbiex (MT)

( * ) Notice: Subject to any disclaimer, the term of this patent is extended or adjusted under 35 U.S.C. 154(b) by 206 days.

(21) Appl. No.: 14/905,011

(22) PCT Filed: Jul. 17, 2014

(86) PCT No.: PCT/IB2014/063189
§ 371 (c)(1),
(2) Date: Jan. 14, 2016

(87) PCT Pub. No.: WO2015/008251
PCT Pub. Date: Jan. 22, 2015

(65) Prior Publication Data
US 2016/0154753 A1    Jun. 2, 2016

(30) Foreign Application Priority Data

Jul. 18, 2013    (AU) .................................. 2013902678
Nov. 25, 2013    (AU) .................................. 2013904532

(51) Int. Cl.
| | | |
|---|---|---|
| G06F 13/372 | (2006.01) | |
| G06F 12/08 | (2016.01) | |
| G06F 13/16 | (2006.01) | |
| G06F 13/364 | (2006.01) | |
| G06F 12/0811 | (2016.01) | |
| G06F 12/0831 | (2016.01) | |

(Continued)

(52) U.S. Cl.
CPC ............ *G06F 13/364* (2013.01); *G06F 3/065* (2013.01); *G06F 3/067* (2013.01); *G06F 3/0619* (2013.01); *G06F 12/082* (2013.01); *G06F 12/0811* (2013.01); *G06F 12/0815* (2013.01); *G06F 12/0831* (2013.01); *G06F 12/0864* (2013.01); *G06F 13/1663* (2013.01); *G06F 13/20* (2013.01); *G06F 13/372* (2013.01); *G06F 13/4068* (2013.01); *G06F 13/4282* (2013.01); *G11C 7/1072* (2013.01); *G06F 2212/283* (2013.01); *G06F 2212/6032* (2013.04); *G06F 2212/621* (2013.01)

(58) Field of Classification Search
None
See application file for complete search history.

(56) References Cited

U.S. PATENT DOCUMENTS

| | | | | |
|---|---|---|---|---|
| 2010/0162053 A1* | 6/2010 | Gillingham | ............. | G06F 11/10 714/49 |
| 2014/0281274 A1* | 9/2014 | Pokam | .................... | G06F 9/321 711/145 |

* cited by examiner

*Primary Examiner* — Kenny S Lin

(57) ABSTRACT

A shared memory computing device optimised for executing realtime software that has at least one interconnect master, a shared memory, N cache modules and M processor cores, where the value of N>=1 and M =N. Each of the N cache modules has a means to implement an update-type cache coherency policy across those N cache modules. Each processor core is assigned a different one of the N cache modules as that processor core's private cache. Furthermore, the memory transfer request latency of non-atomic memory transfer requests issued by each of the M processor cores to the shared memory is not modified by: (a) the memory transfer requests issued by any of the other M processor cores; or (b) the memory transfer requests issued by at least one other interconnect master.

6 Claims, 18 Drawing Sheets

(51) Int. Cl.
*G11C 7/10* (2006.01)
*G06F 12/0815* (2016.01)
*G06F 12/0817* (2016.01)
*G06F 12/0864* (2016.01)
*G06F 3/06* (2006.01)
*G06F 13/20* (2006.01)
*G06F 13/40* (2006.01)
*G06F 13/42* (2006.01)

COMPUTING ARCHITECTURE WITH PERIPHERALS

FIELD OF THE INVENTION

The present invention relates to multi interconnect master computing architectures and is particularly applicable to real-time and mixed-criticality computing involving peripherals.

BACKGROUND OF THE INVENTION

Throughout this specification, including the claims:
a bus master is a type of interconnect master;
a bus target/slave is a type of an interconnect target;
a memory store coupled with a memory controller may be described at a higher level of abstraction as a memory store;
a peripheral may or may not have I/O pins;
a peripheral is connected to an interconnect that transports memory transfer requests;
a peripheral may be memory mapped, such that a memory transfer request to the interconnect target port of a peripheral is used to control that peripheral;
a processor core may be remotely connected to an interconnect over a bridge; and
a definition and description of domino timing effects can be found in [1].

Many shared memory computing devices with multiple bus-masters/interconnect-masters, such as the European Space Agencies' Next Generation Microprocessor architecture [3] experience severe real-time problems [4]. For example, the memory transfer requests of software running on one core of the NGMP architecture experiences unwanted timing interference from unrelated memory transfer requests issued by other bus masters [4] over the shared ARM AMBA AHB [2] interconnect. For example, unwanted timing interference can occur by memory transfer requests issued by other cores and bus master peripherals to the level 2 cache module and SDRAM. Even though most memory transfer requests are in practice at most 32-bytes in length, a single memory transfer request can block the bus from servicing other memory transfer requests for more than 10 clock cycles.

SUMMARY OF THE INVENTION

In contrast, in one aspect, embodiments of the present invention provide a shared memory computing device comprising:
a first clock;
at least M interconnect masters, where the value of M is 4;
at least 1 interconnect target;
a first timeslot based interconnect for transporting memory transfer requests and their corresponding responses, comprising:
an input clock port that is connected to the first clock;
a unidirectional timeslot based interconnect to transport memory transfer requests with T timeslots, where the value of T is at least 4;
a unidirectional timeslot based interconnect to transport memory transfer responses with R timeslots, in which:
for each of the R timeslots that timeslot:
corresponds to one memory transfer request timeslot; and
starts at least L clock cycles after the start time of that corresponding memory request timeslot, where the value of L is at least 3 and less than the value of T;
in which:
at least one interconnect target is connected to the first timeslot based interconnect; and
for each interconnect master I of the M interconnect masters:
each interconnect master I is connected to the first timeslot based interconnect; and
each of the T timeslots is mappable to a different one of the M interconnect masters.

A shared memory computing device optimised for upper-bound worst case execution time analysis comprising:
an on-chip random access memory store comprising at least two interconnect target ports, in which:
the first target port:
has a data path of D-bits in width, the value of D being larger than or equal to 2;
is adapted to sustain a throughput of one D-bit wide memory transfer request per clock cycle; and
is adapted to sustain a throughput of one D-bit wide memory transfer response per clock cycle; and
the second target port:
has a data path of E-bits in width, the value of E being larger than or equal to 1;
is adapted to sustain a throughput of one E-bit wide memory transfer request per clock cycle; and
is adapted to sustain a throughput of one E-bit wide memory transfer response per clock cycle;
a first on-chip shared memory interconnect which:
has a data path of D-bits in width;
is exclusively connected to the first port of the at least two interconnect target ports of the on-chip random access memory;
is adapted to sustain a throughput of one D-bit wide memory transfer request per clock cycle to the on-chip random access memory;
is adapted to sustain a throughput of one D-bit wide memory transfer response per clock cycle; and
has at least two cache modules connected to it, each cache module comprising:
a master port with a D-bit wide data path which is connected to this interconnect; and
a target port;
and a second on-chip shared memory interconnect which:
has a data path of E-bits in width;
is exclusively connected to the second port of the at least two interconnect target ports of the on-chip random access memory;
is adapted to sustain a peak throughput of one E-bit wide memory transfer request per clock cycle to the on-chip random access memory;
is adapted to sustain a peak throughput of one E-bit wide memory transfer response per clock cycle; and
has at least two interconnect masters connected to it.

A shared memory computing device comprising:
a first system interconnect;
an on-chip random access memory store comprising at least one interconnect target port, in which the first interconnect target port is connected to the first system interconnect;
at least one sub-computing device, each sub-computing device comprising:
a first local interconnect;

a first interconnect master connected to a local interconnect of the sub-computing device;
an interconnect bridge comprising two ports, in which:
the first port is connected to the first system interconnect; and
the second port is connected to a local interconnect of the sub-computing device; and
in which the first interconnect master is adapted to issue memory transfer requests to the on-chip random access memory store; and
a first peripheral, comprising:
a first interconnect target port which is connected to the first local interconnect of the first of the at least one sub-computing devices;
a first interconnect master port which is adapted to issue memory transfer requests to the on-chip random access memory store;
in which:
the first interconnect master of the first of the at least one sub-computing devices is adapted to issue memory transfer requests to the first peripheral.

A shared memory computing device comprising:
M interconnect-masters, where the value of M is at least 2, each interconnect-master comprising:
an egress port; and
an ingress port; and
a first timeslot based interconnect for transporting memory transfer requests and their corresponding responses, comprising:
an arbiter and decoder module;
a M-to-1 multiplexer, comprising:
a select port;
M data input ports; and
1 data output port;
and a 1-to-M demultiplexer, comprising:
a select port;
1 data input port; and
M data output ports;
in which:
for each interconnect master I:
the egress port of interconnect master I is connected to the data input port I of the M-to-1 multiplexer; and
the ingress port of interconnect master I is connected to the data output port I of the 1-to-M demultiplexer;
the arbiter and decoder module of the interconnect controls the value supplied to the select port of the M-to-1 multiplexer; and
the value supplied to the select port of the 1-to-M demultiplexer is the value supplied to the select port of the M-to-1 multiplexer delayed by L clock cycles, where the value of L is larger or equal to 3.

A shared memory computing device comprising:
M interconnect-nodes, where the value of M is at least 2, each interconnect-node comprising:
an egress port; and
an ingress port;
a singular interconnect node comprising:
an egress port; and
an ingress port;
a first M×1 interconnect for transporting memory transfer requests and their corresponding responses, comprising:
M bidirectional ports, each comprising:
an ingress port which is connected to the egress port of a different one of the M interconnect-nodes; and
an egress port, which is connected to the ingress port of a different one of the M interconnect-nodes;
a singular bidirectional port comprising:
an egress port which is connected to the ingress port of the singular interconnect node; and
an ingress port which is connected to the egress port of the singular interconnect node;
a parallel-in, serial-out (PISO) M input port×1 output port shift register with M stages, in which:
for each stage I of the M stages: that stage is connected to the egress port of the interconnect node I of M interconnect nodes; and
the output of stage 1 is connected to the egress port of the singular port of the interconnect;
a serial-in, parallel-out (SIPO) 1 input port×M output port module, in which the input is connected to the ingress port of the singular port of the interconnect; and
an arbiter and decoder module which is adapted to control the PISO M×1 shift register and the SIPO 1×M module.

A shared memory computing device optimised for worst case execution time analysis comprising:
N fully associative cache modules, where the value of N is at least 1, each fully associative cache module comprising:
a master port:
a target port;
a means to track dirty cache-lines;
a finite state machine with one or more policies, in which at least one policy:
employs an allocate on read strategy;
employs an allocate on write strategy; and
employs a least recently used eviction strategy; and
N processor cores, in which each core is assigned a different one of the N fully associative cache modules as its private cache.

A shared memory computing device optimised for worst case execution time analysis comprising:
at least one interconnect master;
N cache modules, where the value of N is at least 1, each cache module comprising:
a master port:
a target port; and
a finite state machine that employs an update-type cache coherency policy;
N processor cores, in which each core:
is assigned a different one of the N fully associative cache modules as its private cache; and
in which the execution time of memory transfer requests issued by each of the N processor cores is are not modified by:
the unrelated memory transfer requests issued by any of the other N processor cores; or
the unrelated memory transfer requests issued by at least one other interconnect master.

A bidirectional interconnect for transporting memory transfer requests and their corresponding memory transfer responses, comprising:
a unidirectional interconnect to transport memory transfer requests; and
a unidirectional interconnect to transport memory transfer responses, adapted to transport memory transport responses that includes a copy of the corresponding memory transfer request.

Further inventive aspects of the present invention are set out in the claims appearing at the end of this specification.

BRIEF DESCRIPTION OF THE DRAWINGS

For a better understanding of the invention, and to show how it may be carried into effect, embodiments of it are shown, by way of non-limiting example only, in the accompanying drawings. In the drawings.

DESCRIPTION OF PREFERRED
EMBODIMENTS OF THE INVENTION

Figure 1:
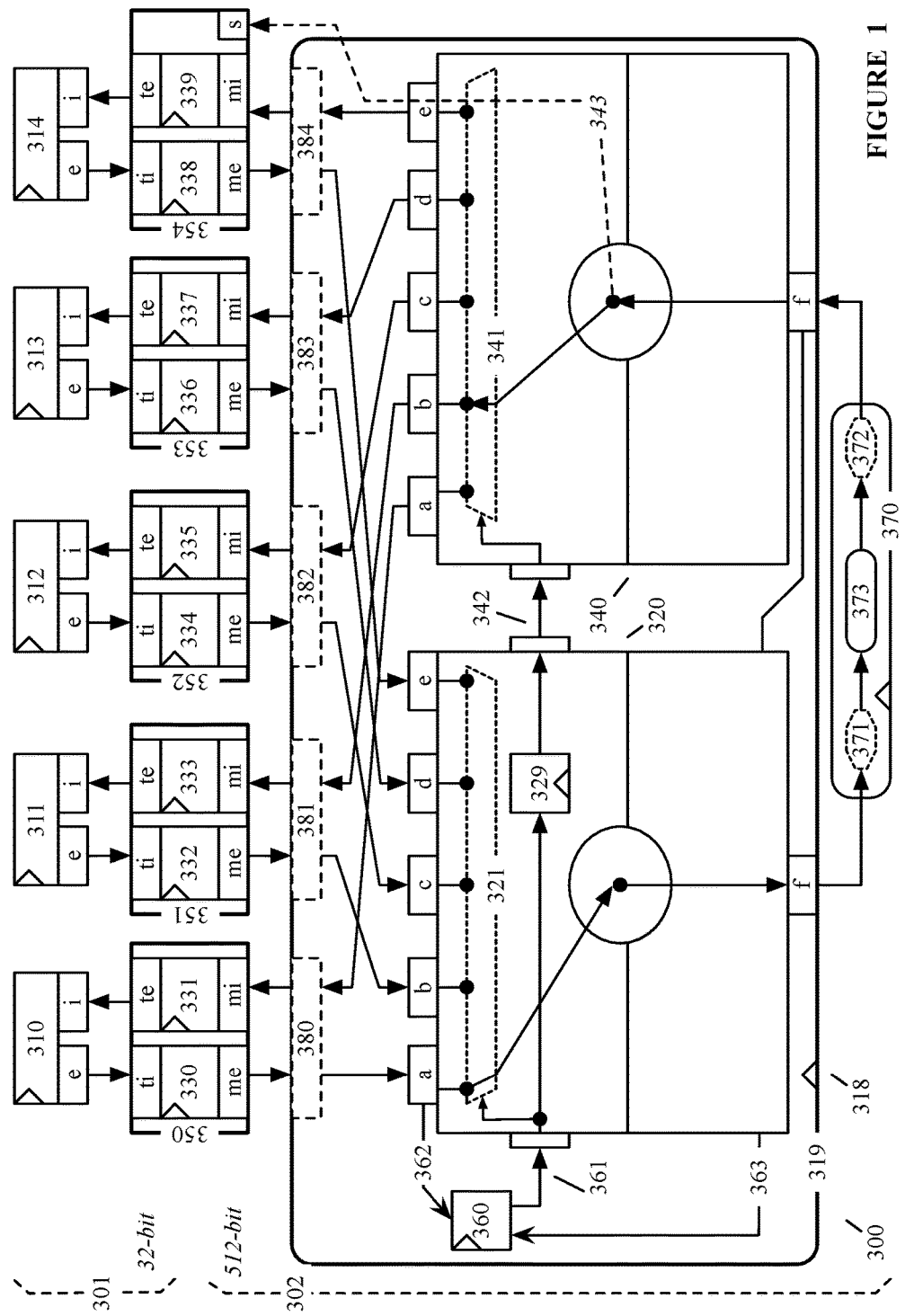
FIG. 1 is a block schematic diagram illustrating preferred embodiments of the present invention.

FIG. 1 is a block schematic diagram illustrating portions of a shared memory computing architecture (300) for preferred embodiments of the present invention. Shared memory computing architecture (300) comprises 5 unidirectional interconnect bridges (350, 351, 352, 353, 354). Each unidirectional interconnect bridge (350, 351, 352, 353, 354) comprises:
    an interconnect target port ({350.ti, 350.te}, {351.ti, 351.te}, {352.ti, 352.te}, {350.ti, 353.te}, {354.ti, 354.te}) comprising:
        an ingress port (350.ti, 351.ti, 352.ti, 353.ti, 354.ti); and
        an egress port (350.te, 351.te, 352.te, 353.te, 354.te);
    an interconnect master port ({350.mi, 350.me}, {351.mi, 351.me}, {352.mi, 352.me}, {353.mi, 353.me}, {354.mi, 354.me}) comprising:
        an ingress port (350.mi, 351.mi, 352.mi, 353.mi, 354.mi); and
        an egress port (350.me, 351.me, 352.me, 353.me, 354.me);
    a memory transfer request module (330, 332, 334, 336, 338) comprising:
        an ingress port (350.ti, 351.ti, 352.ti, 353.ti, 354.ti);
        an egress port (350.me, 351.me, 352.me, 353.me, 354.me);
    a memory transfer response module (331, 333, 335, 337, 339) comprising:
        an ingress port (350.ti, 351.ti, 352.ti, 353.ti, 354.ti); and
        an egress port (350.me, 351.me, 352.me, 353.me, 354.me).

The shared memory computing architecture (300) further comprises:
    M interconnect masters (350, 351, 352, 353, 354), where the value of M is 5, in which each interconnect master comprises:
        an egress port (350.me, 351.me, 352.me, 353.me, 354.me); and
        an ingress port (350.mi, 351.mi, 352.mi, 353.mi, 354.mi); and
    a first timeslot based interconnect (319) for transporting memory transfer requests and their corresponding responses, comprising:
        an arbiter and decoder module (360);
        a M-to-1 multiplexer (321), comprising:
            a select port;
            M data input ports (320.a, 320.b, 320.c, 320.d, 320.e); and
            1 data output port (320.f);
        and a 1-to-M demultiplexer (341), comprising:
            a select port;
            1 data input port (340.f); and
            M data output ports (340.a, 340.b, 340.c, 340.d, 340.e);
    in which:
        for each interconnect master I:
            the egress port of interconnect master I is connected to the data input port I of the M-to-1 multiplexer ({350.me, 320.a}, {351.me, 320.b}, {352.me, 320.c}, {353.me, 320.d}, {354.me, 320.e}); and
            the ingress port of interconnect master I is connected to the data output port I of the 1-to-M demultiplexer ({350.mi, 340.a}, {351.mi, 340.b}, {352.mi, 340.c}, {353.mi, 340.d}, {354.mi, 340.e});
        the arbiter and decoder module (360) of the interconnect (319) controls the value supplied on wire (361) to the select port of the M-to-1 multiplexer (321); and
        the value supplied (on wire 342) to the select port of the 1-to-M demultiplexer (341) is the value supplied to the select port of the M-to-1 multiplexer delayed by the first in first out module (329) for L clock cycles, where the value of L is larger or equal to 3.

The interconnect arbiter and decoder module (360) receives as inputs the control signals, e.g. on wire (362), generated by the 5 interconnect masters (350, 351, 352, 353, 354) that are received on ports (320.a, 320.b, 320.c, 320.d, 320.e) respectively and the control signals on wire (363) generated by the 1 interconnect target (370) and received on port (340.f). Preferably the scheduling scheme of the interconnect arbiter and decoder module (360) is adapted to consider the state of those control signals (such as the values received on wires (362) and (363)). The interconnect arbiter and decoder module (360) generates one or more control signals released as output on ports (340.a, 340.b, 340.c, 340.d, 340.e) that are supplied to the 5 interconnect master's ingress ports (350.mi, 351.mi, 352.mi, 353.mi, 354.mi). The interconnect arbiter and decoder module (360) also generates one or more control signals as outputs (not illustrated) which are supplied over port (320.f) to the interconnect target's (370) ingress port.

Figure 7:
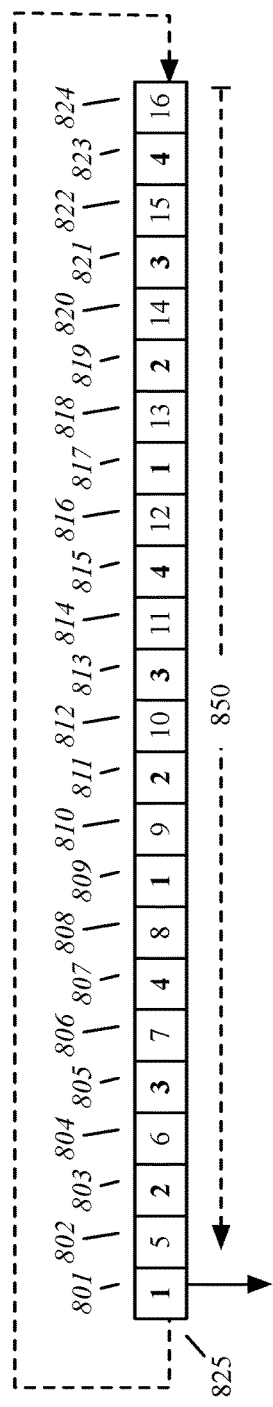
FIGS. 7 and 8 are timeslot scheduling diagrams according to embodiments of the type of FIG. 3
Figure 8:
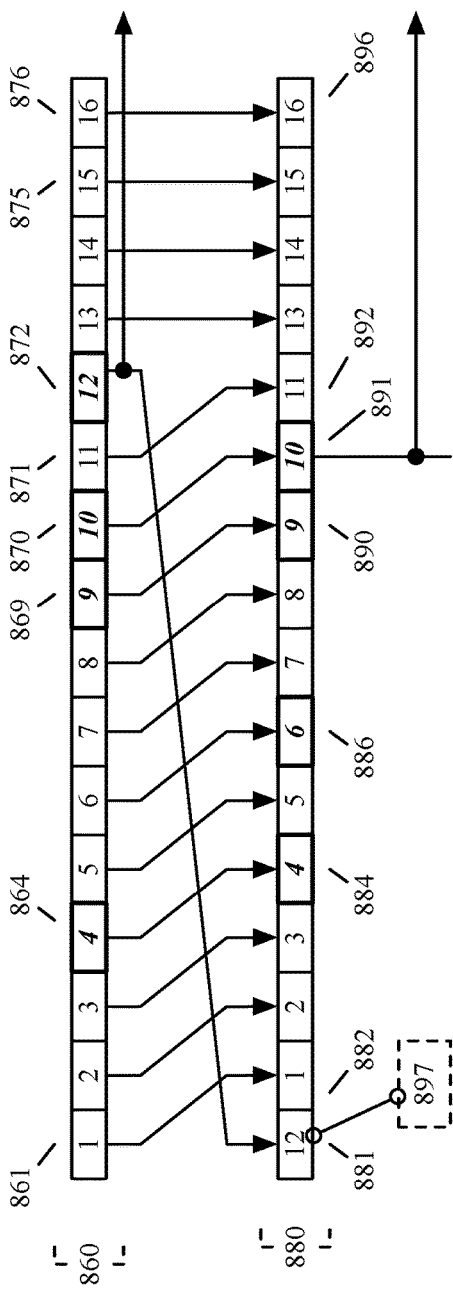

Preferably the arbiter and decoder module (360) of the first timeslot based interconnect (319) employs at least one scheduling scheme selected from the group comprising:
    a least recently granted interconnect master scheme (see FIG. 8);

a least recently granted interconnect master scheme with rate throttling on at least one interconnect master (see FIG. 8);
a static timeslot scheme (see FIG. 5);
a dynamic timeslot scheme (see FIG. 2); and
a time triggered protocol scheme (see FIG. 7);
Preferably the shared memory computing architecture (300) is adapted such that:
the arbiter of the first timeslot based interconnect (319) is adapted to:
grant a first timeslot to one of the M interconnect masters (350, 351, 352, 353, 354);
not grant the next timeslot to that interconnect master; and
grant one of the later timeslots to the that interconnect master;
the first interconnect master is adapted to:
issue a memory transfer request to a first interconnect target during the first timeslot; and
the first interconnect target is adapted to:
transmit at least part of its response to the first interconnect master during the later timeslot granted to the first interconnect master.

Preferably at least one interconnect target (370) can receive two or more outstanding memory transfer requests before releasing a memory transfer response related to the first memory transfer request. Preferably at least one interconnect master (350, 351, 352, 353, 354) is adapted to be able to issue two or more outstanding memory transfer requests to that interconnect target (370) before receiving the memory transfer response corresponding to the first memory transfer request to that interconnect target. For example when a processor core is adapted to concurrently issue a first memory transfer request to retrieve executable code and a second memory transfer request to access data.

Preferably the duration of least one timeslot of the interconnect (319) is 1 clock cycle in length. For example, a first timeslot is 1 clock cycle in length, and the second timeslot is 1 clock cycle in length. In an alternate preferred embodiment of the present invention, each timeslot of the interconnect (319) has a variable duration of length that is upper-bound for that timeslot. For example, the duration of the first timeslot is one 1 clock cycle and the duration of the second timeslot ranges from 1 to 2 clock cycles in length.

For the remainder of the text describing FIG. 1, each timeslot of interconnect (319) has a duration of 1 clock cycle in length, the FIFO module (329) releases the value of each input as output 3 clock cycles later, and the sub modules (371), (373) and (372) of module (370) each take 1 clock cycle to process their inputs and generate a corresponding output.

The shared memory computing architecture (300) further comprises an additional 5 interconnect masters (310, 311, 312, 313, 314), each comprising an egress port (310.e, 311.e, 312.e, 313.e, 314.e) and an ingress port (310.i, 311.i, 312.i, 313.i, 314.i). Each of the additional 5 interconnect masters (310, 311, 312, 313, 314) are connected to the interconnect target ports of the 5 interconnect bridges (350, 351, 352, 353, 354) respectively.

The interconnect target (370) is an on-chip shared memory comprising one interconnect target port, in which that target port:
is adapted to sustain a peak throughput of one memory transfer request per clock cycle; and
is adapted to sustain a peak throughput of one memory transfer response per clock cycle.

Preferably at least one memory transfer request can be buffered by one or more of the M unidirectional interconnect bridges. Preferably at least one of the M unidirectional interconnect bridges is adapted to support read pre-fetching and write combining.

In some preferred embodiments, one or more of the M unidirectional interconnect bridges (350, 351, 352, 353, 354) are interconnect protocol transcoding bridges in which the protocol to transcode is a bus interconnect protocol such as ARM AMBA AHB [2].

In some preferred embodiments, at least two of the M unidirectional interconnect bridges (350, 351, 352, 353, 354) are cache modules, in which each of those cache modules are adapted to complete at least one memory transfer request from a cache-line stored in its cache-line store without waiting for that cache module's time-slot on the timeslot based interconnect (319). In this way, each cache module has the capability to complete memory transfer requests at a rate faster than the worst-case rate that timeslots are granted to that cache module on the timeslot based interconnect (319).

In some cases the data-path width of the 5 interconnect masters (310, 311, 312, 313, 314) will be less than the data-path width of the 5 cache modules' interconnect master ports ({350.mi, 350.me}, {351.mi, 351.me}, {352.mi, 352.me}, {353.mi, 353.me}, {354.mi, 354.me}). For example, as illustrated in the block diagram 300 of FIG. 1, the data-path width of the 5 interconnect masters (310, 311, 312, 313, 314) is 32-bits (301), the data-path width of the timeslot based interconnect (319) is 512-bits (302), and the data-path width of the on-chip memory store (370) is 512-bits (302).

The use of N cache modules (350, 351, 352, 353, 354) connected to the same timeslot based interconnect (319) is highly desirably when performing upper-bound worst case execution time analysis of one or more tasks running in a N processor core (310, 311, 312, 313, 314) architecture. Benefits include improved decoupling of the execution time of N concurrently outstanding memory transfer requests issued by N different cores (310, 311, 312, 313, 314), and to mask some of the access time latencies of memory transfer requests addressed to the shared on-chip memory (370) over that timeslot based interconnect (319). Preferably each of those N cache modules (350, 351, 352, 353, 354) has a means for maintaining cache coherency with the N-1 other cache modules (350, 351, 352, 353, 354) with zero unwanted timing interference incurred against the memory transfer requests received on that cache's interconnect target port.

FIG. 1 also illustrates embodiments of the invention in which a shared memory computing architecture (300) comprises:
a first clock (not illustrated);
M interconnect masters (350, 351, 352, 353, 354), where the value of M is 5;
1 interconnect target (370);
a first timeslot based interconnect (319) for transporting memory transfer requests and their corresponding responses, comprising:
an input clock port (318) that is connected to the first clock;
a unidirectional timeslot based interconnect (320) to transport memory transfer requests with T timeslots, where the value of T is 5;
a unidirectional timeslot based interconnect (340) to transport memory transfer responses with R timeslots, where the value of R is 5, in which:
for each of the R timeslots, that timeslot:

corresponds to one memory transfer request timeslot; and starts at least L clock cycles after the start time of that corresponding memory request timeslot, where the value of L is 3;

in which:

interconnect target (370) is connected to the first timeslot based interconnect (319);

for each interconnect master I of the M interconnect masters (350, 351, 352, 353, 354):

each interconnect master I is connected to the first timeslot based interconnect (319); and each of the T timeslots is mappable to a different one of the M The shared memory computing architecture (300) further comprises an on-chip random access memory store (370), comprising:

an input clock port that is connected to the first clock (not illustrated); and at least one interconnect target port which is connected to the first timeslot based interconnect (319), and in which:

each memory transfer request takes at most K clock cycles to complete under fault-free operation, where the value of K is 3; and that target port can sustain a throughput of 1 memory transfer request per clock cycle.

In a preferred embodiment of the preferred invention the interconnect target (370) comprises:

a first delay buffer (371) to delay memory transfer requests;

an inner interconnect target (373);

a second delay buffer (372) to delay memory transfer responses;

in which:

the input of the interconnect target (370) is supplied as input to the first delay buffer (371);

the output of the first delay buffer (371) is supplied as input to the module (373);

the output of the module (373) is supplied as input to the second delay buffer (372); and the output of the second delay buffer (372) is supplied as the output of the interconnect target (370).

In this way, it is possible to transform any interconnect target into an interconnect target that delays its memory transfer requests and memory transfer responses. The same type of approach can be adapted to transform any interconnect master into an interconnect master that delays its memory transfer requests to the interconnect and delays their corresponding responses received from that interconnect.

Figure 2:
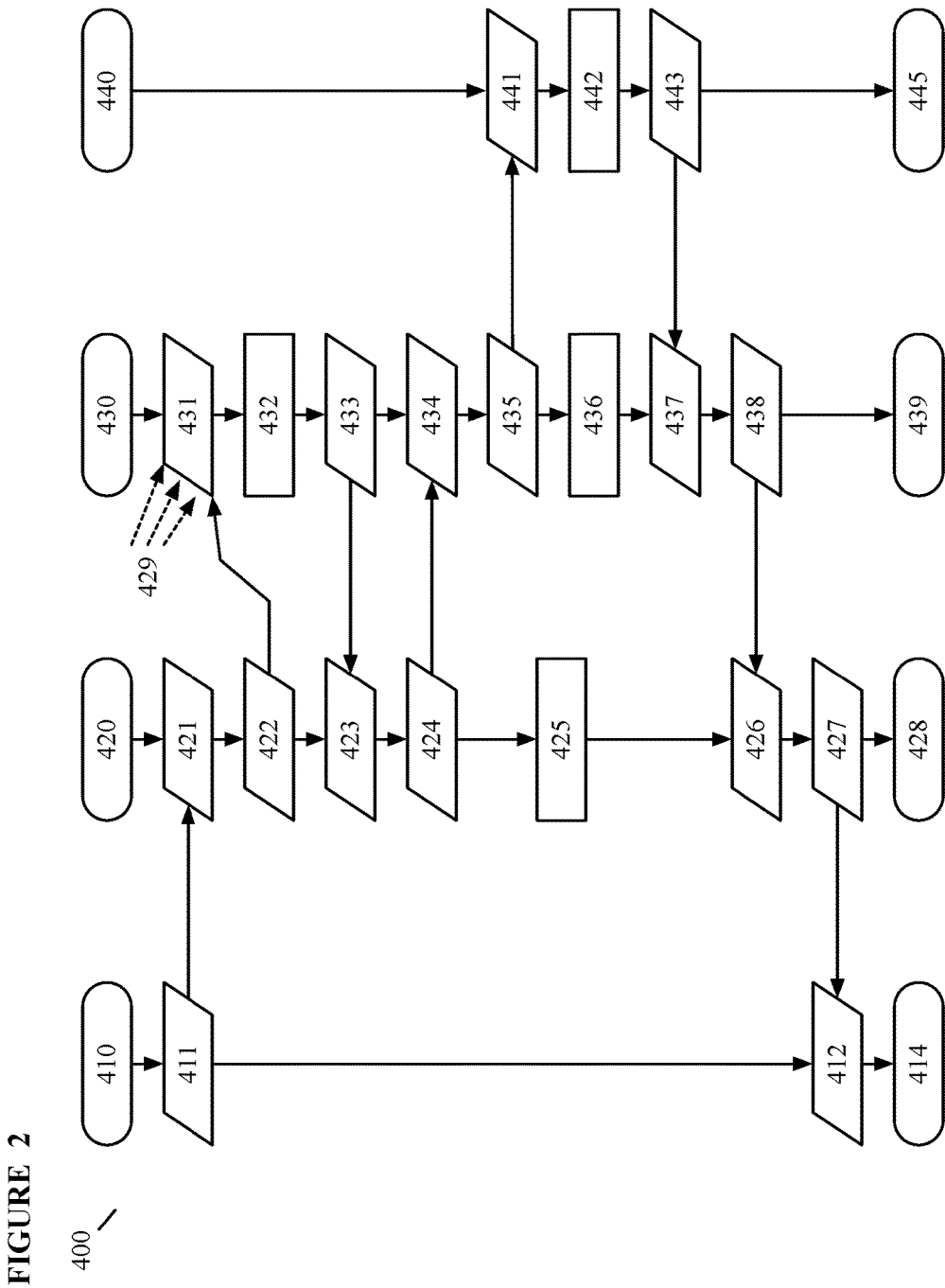
FIG. 2 is a flow-chart illustrating processes according to the embodiments of FIG. 1.

FIG. 2 is a flow-chart illustrating the steps in a memory transfer request process (400) from an interconnect master (310) to a memory store (370) of FIG. 1 according to preferred embodiments of the present invention. In FIG. 2 the value of L is 3. Each of the interconnect bridges (350) to (354) is adapted to:

buffer a single contiguous region of memory that is 512-bits wide;

perform 512-bit wide read and 512-bit wide write operations over its master port to the interconnect (319);

support write combining of 32-bit write memory transfer requests received over its target port to its 512-bit wide buffer; and support 32-bit wide read memory transfer requests received over its target port to the contents of that 512-bit wide buffer.

In step 410, start the interconnect master (310) read memory transfer request process.

In step 411, the interconnect master (310) issues a read memory transfer request of 32-bits over the egress port (310.e) to the target port {350.ti, 350.te} of the interconnect bridge (350).

In step 412, the interconnect master (310) waits for and receives the memory transfer response from the interconnect bridge (350) on the ingress port (310.i). This completes the 32-bit read memory transfer request issued in step 411.

In step 413, end the interconnect master (310) read memory transfer request process.

In step 420, start the interconnect bridge (350) memory transfer relay process.

In step 421, the interconnect bridge (350) receives the 32-bit read memory transfer request issued in step 411 on its interconnect target port {350.ti, 350.te}.

In step 422, the interconnect bridge (350) requests a timeslot on the timeslot based interconnect over its interconnect master port {350.mi, 350.me}. This interconnect request signal is transported over wire (362) and received by the interconnect arbiter (360).

In step 423, the interconnect bridge (350) waits one or more clock cycles until it is granted a timeslot on the timeslot based interconnect (319).

In step 424, the interconnect bridge (350) is allotted an upper-bound duration of time within the timeslot to issue its memory transfer request and any associated data. The interconnect bridge (350) issues a 512-bit read memory transfer request over its interconnect master port to the timeslot based interconnect (319).

In step 425, the interconnect bridge (350) waits for the memory transfer request to be processed. In this particular example, the interconnect bridge (350) does not issue any additional memory transfer requests onto the timeslot based interconnect (319) while waiting for the currently outstanding memory transfer request to be processed.

In step 426, the interconnect bridge (350) is notified by the timeslot based interconnect (319) when the 512-bit wide read memory transfer request response is available. The interconnect bridge is allotted an upper-bound duration of timeslot to receive the response of that memory transfer request. The interconnect bridge (350) receives the response to its memory transfer request and buffers it locally.

In step 427, the interconnect bridge relays the requested 32-bits of data from the 512-bit read memory transfer response over its interconnect target port back to the interconnect master (310).

In step 428, end the interconnect bridge (350) memory transfer relay process.

In step 430, start the timeslot based interconnect (319) memory transfer request cycle.

In step 431, the timeslot based interconnect arbiter and decoder module (360) receives the value on each interconnect request signal of the 5 interconnect bridges (350, 351, 352, 353, 354) connected to the timeslot based interconnect (319).

In step 432, the timeslot based interconnect arbiter and decoder module (360) evaluates the received value from each interconnect request signal according to the policy, configuration and execution history of the currently active arbitration scheme. For example, if the timeslot based interconnect arbiter is currently employing a least recently granted interconnect master scheme, then the least recently granted interconnect master is selected from the set of interconnect masters currently requesting a timeslot on the interconnect (see FIG. 8). Alternatively, if the timeslot based interconnect arbiter and decoder module (360) is currently using a cyclic timeslot scheduling scheme, then the value on the interconnect request signals does not influence the scheduling of timeslots.

In step 433, the timeslot based interconnect arbiter and decoder module (360) is illustrated as having selected the interconnect bridge (350) for the next timeslot. The timeslot based interconnect arbiter and decoder module (360) informs the interconnect bridge (350) it has been granted the next timeslot on the interconnect (319). In the next clock cycle, the timeslot based interconnect arbiter adjusts the value of the index to the multiplexer (321) to select the data-path of port (320.*a*).

In step 434, a copy of the read memory transfer request and associated data is transmitted over the interconnect master port of the interconnect bridge (350) and is received on the data-path of port (320.*a*).

In step 435, a copy of the read memory transfer request received by the timeslot based interconnect (319) is forwarded to the memory store (370) which is connected to the interconnect target port (320.*f*) of the timeslot based interconnect (319). For example, the multiplexer (321) forwards the selected information received on its data-path to the target port (320.*f*).

In step 436, the value supplied to the select input of the multiplexer (321) is delayed (329) for L clock cycles.

In step 437, the value received on the data-path of the target port (340.*f*) is supplied as input to the data input port of the demultiplexer (341). The select port of the demultiplexer receives the value supplied to the select port of the multiplexer (321) L clock cycles earlier.

In step 438, the value received on target port (340.*f*) is forwarded to the interconnect bridge (350) and received in step 426.

In step 439, end the timeslot based interconnect (319) memory transfer request cycle.

In step 440, start the memory store (370) memory transfer request cycle.

In step 441, memory store (370) receives a 512-bit wide read memory transfer request and delays it in the buffer (371) for 1 clock cycle.

In step 442, the memory store (370) processes the read memory transfer request (373) in 1 clock cycle and delays the memory transfer response output for 1 clock cycle in the buffer (327).

In step 443, the memory store (370) transmits the read memory transfer request response.

In step 445, end the memory store (370) memory transfer request cycle.

In a preferred embodiment of the present invention, a snarling cache module (354) snoops every memory transfer response released as output by the de-multiplexer (341) over wire (343). Preferably each memory transfer response incorporates a copy of its corresponding memory transfer request.

In a preferred embodiment of the present invention, each of the 5 interconnect master ports of the interconnect (319) are connected to a different memory management unit (MMU) (380, 381, 382, 383, 384) respectively. In this way, the 5 MMU (380, 381, 382, 383, 384) provide a means to enforce an access control policy between interconnect masters and the interconnect target from within the interconnect (319).

In an alternate preferred embodiment of the present invention, interconnect node (370) is an interconnect master, and interconnect nodes (350) to (354) are protocol transcoding bridges, interconnect nodes (310) to (314) are interconnect targets, and modules (380) to (384) are not used.

Figure 3:
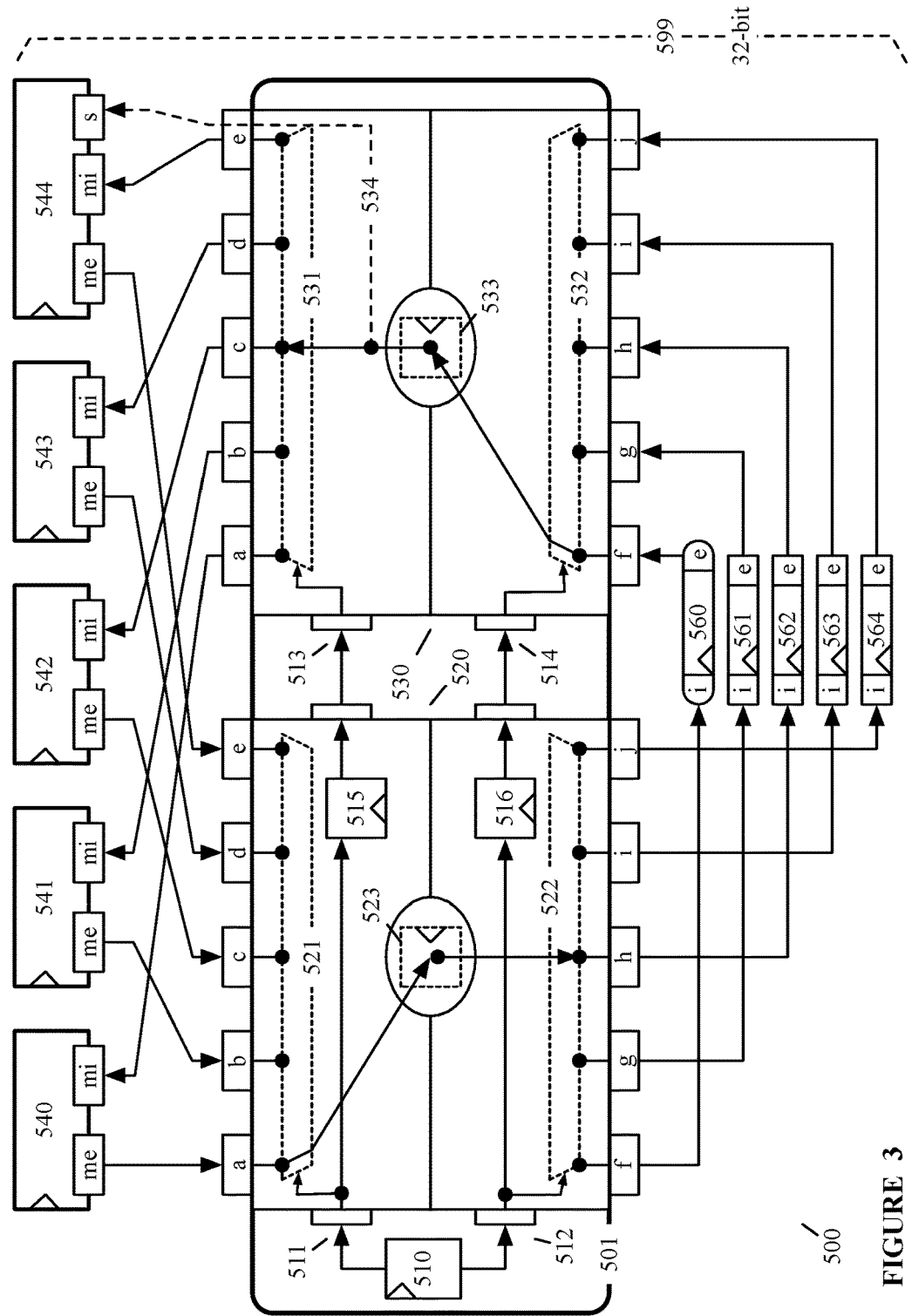
FIG. 3 is a block schematic diagram preferred embodiments of the present invention.

FIG. 3 is a block schematic diagram illustrating portions of a shared memory computing architecture (500) according to preferred embodiments of the present invention. The shared memory computing architecture (500) comprises:
  M interconnect masters (540, 541, 542, 543, 544), where the value of M is 5, in which each interconnect master comprises:
    an egress port (540.*me*, 541.*me*, 542.*me*, 543.*me*, 544.*me*); and
    an ingress port (540.*mi*, 541.*mi*, 542.*mi*, 543.*mi*, 544.*mi*); and
  a first timeslot based interconnect (501) for transporting memory transfer requests and their corresponding responses, comprising:
    an arbiter and decoder module (510);
    a M-to-1 multiplexer (521), comprising:
      a select port;
      M data input ports (520.*a*, 520.*b*, 520.*c*, 520.*d*, 520.*e*); and
      1 data output port;
    and a 1-to-M demultiplexer (531), comprising:
      a select port;
      1 data input port; and
      M data output ports (531.*a*, 531.*b*, 531.*c*, 531.*d*, 531.*e*);
    in which:
      for each interconnect master I:
        the egress port of interconnect master I is connected to the data input port I of the M-to-1 multiplexer ({540.*me*, 520.*a*}, {541.*me*, 520.*b*}, {542.*me*, 520.*c*}, {543.*me*, 520.*d*}, {544.*me*, 520.*e*}); and
        the ingress port of interconnect master I is connected to the data output port I of the 1-to-M demultiplexer ({540.*mi*, 531.*a*}, {541.*mi*, 531.*b*}, {542.*mi*, 531.*c*}, {543.*mi*, 531.*d*}, {544.*mi*, 531.*e*});
      the arbiter and decoder module (510) of the interconnect (501) controls the value supplied on wire (511) to the select port of the M-to-1 multiplexer (521); and
      the value supplied on wire (513) to the select port of the 1-to-M demultiplexer (531) is the value supplied to the select port of the M-to-1 multiplexer delayed by the first in first out module (515) by L clock cycles, where the value of L is 3.

The shared memory computing architecture (500) further comprises:
  S interconnect targets (560, 561, 562, 563, 564), where the value of S is 5, each interconnect target comprising:
    an egress port (560.*e*, 561.*e*, 562.*e*, 563.*e*, 564.*e*); and
    an ingress port (560.*i*, 561.*i*, 562.*i*, 563.*i*, 564.*i*);
  in which the first timeslot based interconnect for transporting memory transfer requests and their corresponding responses further comprises:
    a 1-to-S demultiplexer (522), comprising:
      a select port;
      1 data input port; and
      S data output ports (520.*f*, 520.*g*, 520.*h*, 520.*i*, 520.*j*); and
    and a S-to-1 multiplexer (532), comprising:
      a select port;
      S data input ports (530.*f*, 530.*g*, 530.*h*, 530.*i*, 530.*j*); and
      1 data output port;
    in which:
      the data input port of the 1-to-S demultiplexer (522) receives as input the output of the M-to-1 multiplexer (521);

the data input port of the 1-to-M demultiplexer (533) receives as input the output of the S-to-1 multiplexer (533);

for each interconnect target J:
the ingress port of interconnect target J is connected to the data output port I of the 1-to-S demultiplexer ({560.i, 520.f}, {561.i, 520.g}, {562.i, 520.h}, {563.i, 520.i}, {564.i, 520.j}); and
the egress port of interconnect target J is connected to the data input port S of the S-to-1 multiplexer ({560.e, 530.f}, {561.e, 530.g}, {562.e, 530.h}, {563.e, 530.i}, {564.e, 530.j}); and
the arbiter and decoder module (510) of the interconnect controls the value supplied on wire (512) to the select port of the 1-to-S demultiplexer (522); and
the value supplied on wire (514) to the select port of the S-to-1 multiplexer is the value supplied to the select port of the 1-to-S demultiplexer (522) delayed by the first in first out module (516) by L clock cycles.

In FIG. 3, the data-path width of the interconnect 501 is 32-bits (599).

The interconnect arbiter and decoder module (510) receives as inputs the control signals (not illustrated) generated by the 5 interconnect masters (540, 541, 542, 543, 544) that are received on ports (520.a, 520.b, 520.c, 520.d, 520.e) respectively and the control signals (not illustrated) generated by the 5 interconnect targets (560, 561, 562, 563, 564) and received on ports (530.f, 530.g, 530.h, 530.i, 530.j). Preferably one or more of the scheduling scheme of the arbiter and decoder module (510) is adapted to consider the state of those control signals.

The interconnect arbiter and decoder module (510) generates one or more control signals as output on ports (530.a, 530.b, 530.c, 530.d, 530.e) that are supplied to the 5 interconnect master's ingress ports (540.mi, 541.mi, 542.mi, 543.mi, 544.mi) respectively. The interconnect arbiter and decoder module (510) also generates one or more control signals as outputs (not illustrated) which are supplied over ports (320.f, 320.g, 320.h, 320.i, 320.j) to the ingress ports (560.i, 561.i, 562.i, 563.i, 564.i) of the interconnect targets (560, 561, 562, 563, 564) respectively.

Preferably the arbiter and decoder module (510) of the timeslot based interconnect (501) employs at least one scheduling scheme selected from the group comprising:
a least recently granted interconnect master scheme (see FIG. 8);
a least recently granted interconnect master scheme with rate throttling on at least one interconnect master (see FIG. 8);
a static timeslot scheme (see FIG. 5);
a dynamic timeslot scheme; and
a time triggered protocol scheme (see FIG. 7).

Preferably the shared memory computing architecture (500) is adapted such that:
the arbiter and decoder module (510) of the first timeslot based interconnect (501) is adapted to:
grant a first timeslot to one of the M interconnect masters (540, 541, 542, 543, 544);
not grant the next timeslot to that interconnect master; and
grant one of the later timeslots to the that interconnect master;
the first interconnect master is adapted to:
issue a memory transfer request to a first interconnect target during the first timeslot; and
the first interconnect target is adapted to:
transmit at least part of its response to the first interconnect master during the later timeslot granted to the first interconnect master.

Preferably at least one interconnect target (560, 561, 562, 563, 564) can receive two or more outstanding memory transfer requests before releasing a memory transfer response related to the first memory transfer request. Preferably at least one interconnect master (560, 561, 562, 563, 564) can issue two or more outstanding memory transfer requests to that interconnect target before receiving the memory transfer response corresponding to the first memory transfer request to that interconnect target. For example a processor core (540) may concurrently issue a memory transfer request to retrieve executable code and a memory transfer request to access data.

Preferably the duration of least one timeslot of the first timeslot based interconnect (501) is 1 clock cycle in length. For example, a first timeslot is 1 clock cycle in length, and the second timeslot is 1 clock cycle in length. In an alternate preferred embodiment, each timeslot of the first timeslot based interconnect has a variable duration of length that is upper-bound for that timeslot. For example, the duration of the first timeslot is one 1 clock cycle and the duration of the second timeslot ranges from 1 to 2 clock cycles in length.

For the remainder of the text describing FIG. 3, each timeslot of the interconnect (501) has a duration of 1 clock cycle in length, the FIFO (515) releases the value of each input as output 3 clock cycles later, the FIFO (516) releases the value of each input as output 3 clock cycles later, and the on-chip memory store (560) releases its output after 3 clock cycles. The interconnect target peripherals (561) to (564) take a variable amount of time to generate memory transfer responses to the memory transfer requests they receive.

Figure 4:
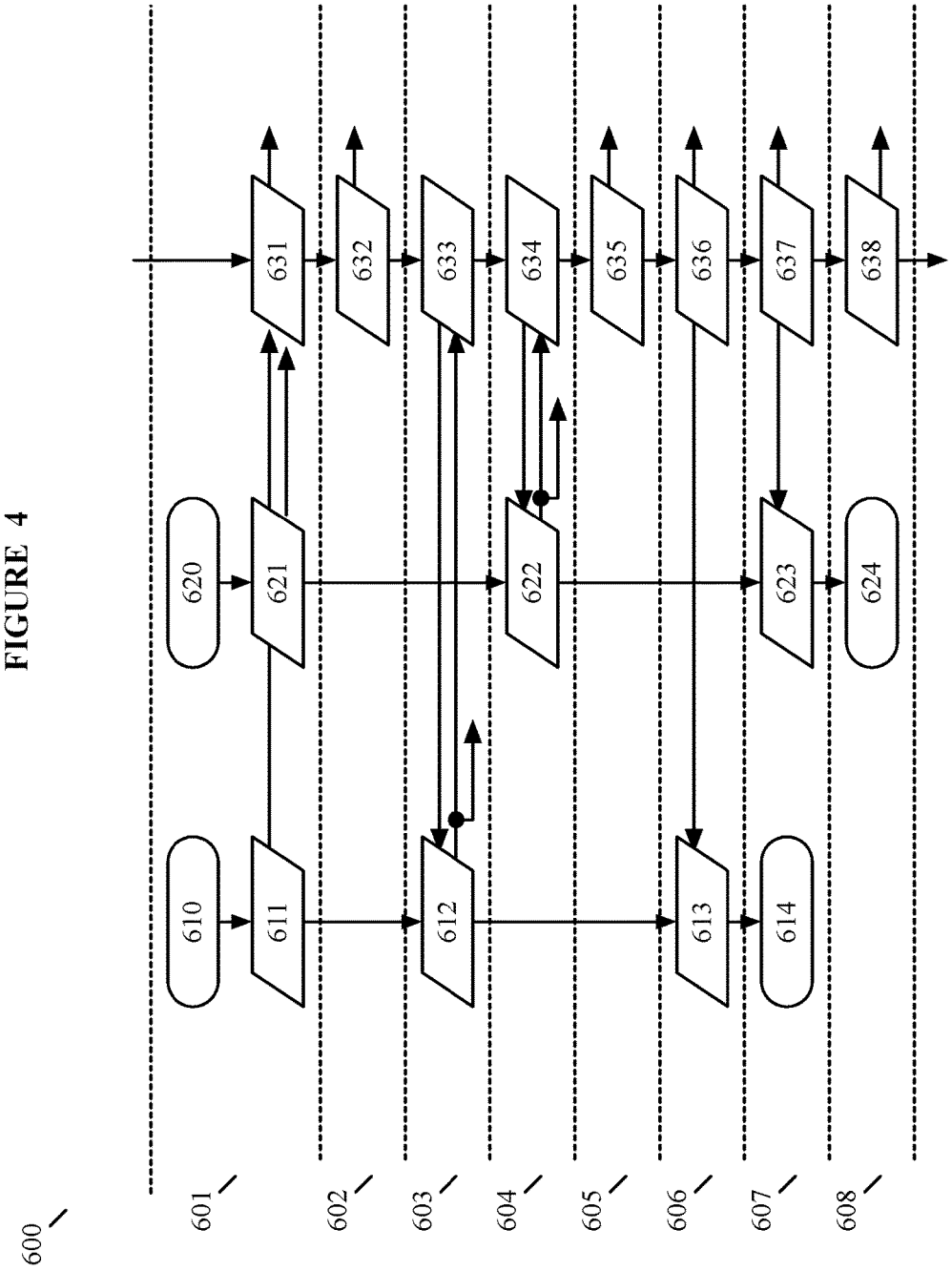
FIG. 4 is a flow-chart illustrating processes according to the embodiments of FIG. 3.

FIG. 4 is a flow-chart illustrating (600) the steps of two concurrent memory transfer requests issued from 2 interconnect masters in the same clock-cycle to two different interconnect targets of FIG. 3. The value of L is 3, the interconnect arbiter and decoder module (510) is employing a static round-robin timeslot schedule in which each timeslot has a fixed duration of 1 clock cycle in length according to a preferred embodiment of the present invention. In this pedagogical example, the interconnect masters (540) to (544) are adapted to issue memory transfer requests in the same clock cycle they receive notification of being granted the current timeslot. Furthermore, the interconnect arbiter and decoder module (510) is assumed to already be started and operating.

In clock cycle 1 (601):
In step 631, the interconnect arbiter and decoder module (510) grants the current timeslot of the timeslot based interconnect (501) to interconnect master (543). Interconnect master (543) does not issue a memory transfer request.
In step 610, start the memory transfer request process for interconnect master (540).
In step 611, interconnect master (540) requests a timeslot on the timeslot based interconnect (501).
In step 620, start the memory transfer request process for interconnect master (541).
In step 621, interconnect master (541) requests a timeslot on the timeslot based interconnect (501).

In clock cycle 2 (602):
In step 632, the interconnect arbiter and decoder module (510) grants the current timeslot of the interconnect (501) to interconnect master (544), that interconnect master does not issue a memory transfer request.

In clock cycle 3 (603):
In step 633, the interconnect arbiter and decoder module (510) signals to interconnect master (540) that it has been granted the current timeslot on the interconnect (501). The interconnect arbiter and decoder module sets the value of the select input of the multiplexer (521) to select interconnect master (540). That value is also forwarded to the delay module (515) and is delayed for 3 clock cycles before being forwarded to the select input of demultiplexer (531).
In step 612, the interconnect master (540) issues a memory transfer request addressed to peripheral (562) along with all associated data to the timeslot based interconnect (501) in one clock cycle.
In step 633, the interconnect arbiter and decoder module (510) decodes the address of that memory transfer request, identifies that the memory address corresponds the address range of the peripheral (562) and sets the value of the select input on the demultiplexer (522) to select peripheral (562). That value is also forwarded to the delay module (516) and is delayed for 3 clock cycles before being forwarded to the select input of multiplexer (532).
In clock cycle 4 (604):
In step 634, the interconnect arbiter and decoder module (510) signals to interconnect master (541) that it has been granted the current timeslot on the interconnect (501). The interconnect arbiter and decoder module (510) sets the value of the select input of the multiplexer (521) to select interconnect master (541). That value is also forwarded to the delay module (515) and is delayed for 3 clock cycles before being forwarded to the select input of demultiplexer (531).
In step 622, the interconnect master (541) issues a memory transfer request addressed to peripheral (563) along with all associated data in one clock cycle to the timeslot based interconnect (501).
In step 634, the interconnect arbiter and decoder module (510) decodes the address of that memory transfer request, identifies that the memory address corresponds the address range of the peripheral (563) and sets the value of the select input on the demultiplexer (522) to select peripheral (563).
In clock cycle 5 (605):
In step 635, the interconnect arbiter and decoder module (510) grants the current timeslot of the interconnect to interconnect master (542). Interconnect master (542) does not issue a memory transfer request.
In clock cycle 6 (606):
The peripheral (562) generates its memory transfer response to the interconnect transfer request issued in step 612.
In step 636, the interconnect arbiter and decoder module (510) grants the current timeslot of the interconnect to interconnect master (543). Interconnect master (543) does not issue a memory transfer request. The index to the multiplexer (532) selects peripheral (562), and the demultiplexer (531) selects interconnect master (540), forwarding the entire memory transfer response from the peripheral (562) to interconnect master (540) in one clock cycle.
In step 613 the interconnect master (540) receives the response.
In clock cycle 7 (607):
The peripheral (563) generates its response to the interconnect transfer request issued in step 613.

In step 637, the interconnect arbiter and decoder module (510) grants the current timeslot of the interconnect (501) to interconnect master (544). Interconnect master (544) does not issue a memory transfer request. The index to the multiplexer (532) selects peripheral (563), and the demultiplexer (531) selects interconnect master (541), forwarding the entire memory transfer response from the peripheral (563) to interconnect master (541) in one clock cycle.
In step 623, the interconnect master (541) receives the response.
End of the memory transfer request process for interconnect master (540).
In clock cycle 8 (608):
In step 638, the interconnect arbiter and decoder module (510) grants the current timeslot of the interconnect to interconnect master (540). Interconnect master (540) does not issue a memory transfer request.
End of the memory transfer request process for interconnect master (541).

In a preferred embodiment of the present invention, a snarling cache module (544) snoops every memory transfer response released as output by the de-multiplexer (531) over wire (534). Preferably each memory transfer response incorporates a copy of its corresponding memory transfer request.

In a preferred embodiment of the present invention, each of the 5 interconnect master ports of the interconnect (501) are connected to a different memory management unit (MMU) (not illustrated) respectively. In this way, the 5 MMU provide a means to enforce an access control policy between interconnect masters and the interconnect target from within the interconnect (501).

It is further preferred that the means to enforce an access control policy is adapted to ensure that no more than one interconnect master (540 to 544) can issue memory transfer requests to a given interconnect target (560 to 564). In this way the access control policy guarantees that a memory transfer request to that interconnect target (560 to 564). will not be delayed by another other interconnect master (540 to 544).

In some cases, for the purpose of increasing the clock-speed of the circuitry, it may be desirable to increase the pipeline depth of the interconnect (501) by adding registers (523) and (533).

In a preferred embodiment of the present invention, each of the M interconnect masters (540, 541, 542, 543, 544) are interconnect bridges.

Figure 5:
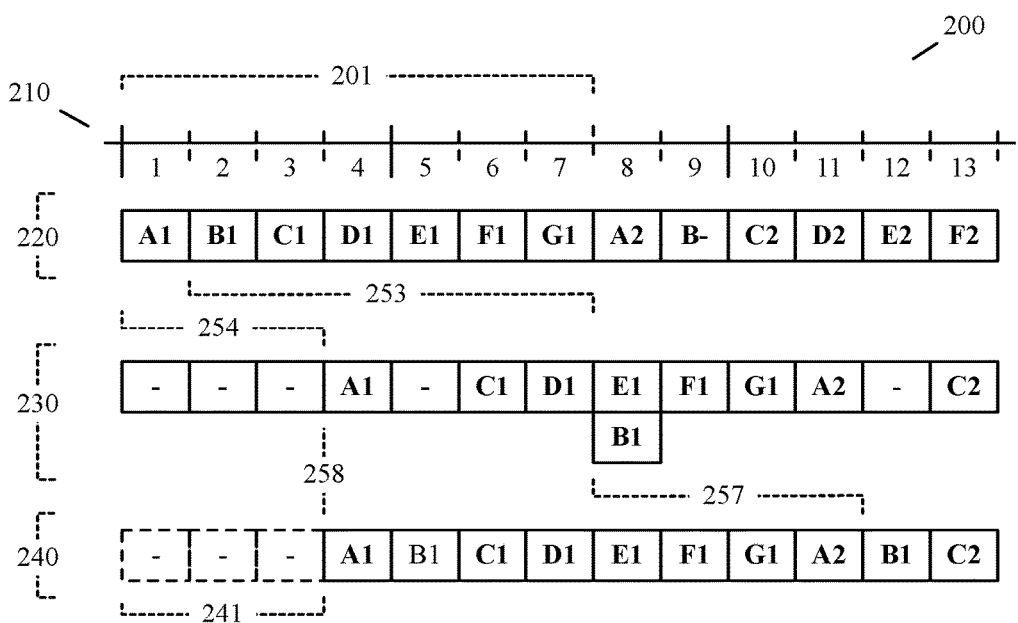
FIG. 5 is a timing diagram illustrating timing according to the embodiments of figure.

FIG. 5 is a timing diagram illustrating 3 rows of timing events (200) for memory transfer requests (220), their completion times (230) and their response times (240) on a timeslot based interconnect for transporting memory transfer requests generated by a shared memory computing architecture of the type illustrated in FIG. 3 according to a preferred embodiment of the present invention.

Timeline 210 illustrates 13 timeslots, the duration of each timeslot being 1 clock cycle in length.

Row 220 illustrates the consecutive mapping of 7 interconnect masters (not illustrated) labelled (A) to (G) to 13 timeslots in a statically scheduled round-robin scheme with a period of 7 clock cycles (201). In this illustration each interconnect master continually issues back-to-back blocking read memory transfer requests. By blocking, it is meant that each interconnect master waits for the response of any of its outstanding memory transfer requests before issuing its next memory transfer request. In this illustration, each interconnect master is issuing a memory transfer request to a different interconnect target (not illustrated).

Specifically, row (220) illustrates the timing of memory transfer requests issued on a unidirectional timeslot based interconnect with 7 timeslots as follows: the first memory transfer request is issued by interconnect master (A) at timeslot (220.1); the first memory transfer request is issued by interconnect master (B) at timeslot (220.2); the first memory transfer request is issued by interconnect master (C) at timeslot (220.3); the first memory transfer request is issued by interconnect master (D) at timeslot (220.4); the first memory transfer request is issued by interconnect master (E) at timeslot (220.5); the first memory transfer request is issued by interconnect master (F) at timeslot (220.6); the first memory transfer request is issued by interconnect master (G) at timeslot (220.7); the second memory transfer request is issued by interconnect master (A) at timeslot (220.8); no memory transfer request is issued by interconnect master (B) at timeslot (220.9); the second memory transfer request is issued by interconnect master (C) at timeslot (220.10); the second memory transfer request is issued by interconnect master (D) at timeslot (220.11); the second memory transfer request is issued by interconnect master (E) at timeslot (220.12); and the second memory transfer request is issued by interconnect master (F) at timeslot (220.13).

Row 230 illustrates the time at which each memory transfer request completes: no memory transfer requests are completed on timeslots (130.1), (130.2), (130.3) and (130.5); the memory transfer request (220.1) completes at timeslot (230.4); the memory transfer request (220.2) completes at timeslot (230.8); the memory transfer request (220.3) completes at timeslot (230.6); the memory transfer request (220.4) completes at timeslot (230.7); the memory transfer request (220.5) completes at timeslot (230.8); the memory transfer request (220.6) completes at timeslot (230.9); the memory transfer request (220.7) completes at timeslot (230.10); the memory transfer request (220.8) completes at timeslot (230.11); the memory transfer request (220.9) completes at timeslot (230.12); and the memory transfer request (220.10) completes at timeslot (230.13).

Row 240 illustrates the timing of memory transfer responses on a second unidirectional timeslot based interconnect with 7 timeslots: the memory transfer request (220.1) receives its completion response at timeslot (240.4); the memory transfer request (220.2) receives a completion pending response at timeslot (240.5); the memory transfer request (220.2) receives its completion response (240.11); the memory transfer request (220.3) receives its completion response at timeslot (240.6); the memory transfer request (220.4) receives its completion response at timeslot (240.7); the memory transfer request (220.5) receives its completion response at timeslot (240.8); the memory transfer request (220.6) receives its completion response at timeslot (240.9); the memory transfer request (220.7) receives its completion response at timeslot (240.10); the memory transfer request (220.8) receives its completion response at timeslot (240.11); there is no memory transfer request issued at (220.9); the memory transfer request (220.10) receives its completion response at timeslot (240.13).

In this illustration (200), the interconnect targets of interconnect masters (A) and (C) to (G) complete are guaranteed to complete their memory transfer request within 3 timeslots (254), where as the interconnect target of interconnect master (B) is guaranteed to complete its memory transfer request within 6 timeslots (253).

FIG. 5 illustrates that the alignment of the memory transfer request timeslots (120) and the memory transfer response timeslots ({220.1, 240.4}, {220.2, 240.5}, {220.3, 240.6}, . . . ) are phase shifted by 3 clock cycles to the right (241). In this case, 9 out of 10 memory transfer responses (240.4, 240.6, 240.7, 240.8, 240.9, 240.10, 240.11, 240.12, 240.13) were not delayed (254) longer than necessary (258), resulting in significantly improved performance when compared to not phase shifting the time between the request timeslot and response timeslots.

Only one (230.B1) of the 13 memory transfer responses (230) was delayed. In this case, it was delayed by 4 clock cycles (257). Advantageously, the idle timeslot (240.5) and the delay of the memory transfer response (230.8) had no impact on the timing of memory transfer requests/responses of any other interconnect masters. Ideally the phase shifting is selected to optimise for the round-trip time for the majority of memory transfer requests at the cost of a relatively small increase in latency for the minority.

In this way we have described the timing behaviour of a shared memory computing architecture that comprises:
M interconnect masters (A, B, C, D, E, F, G), where the value of M is 7;
7 interconnect targets;
a first timeslot based interconnect for transporting memory transfer requests and their corresponding responses, comprising:
a unidirectional timeslot based interconnect to transport memory transfer requests (220) with T timeslots, where the value of T is 7 (201);
a unidirectional timeslot based interconnect to transport memory transfer responses (240) with R timeslots, in which:
for each of the R timeslots, that timeslot:
corresponds to one memory transfer request timeslot ({240.4, 220.1}, {240.5, 220.2}, . . . ); and
starts at least L clock cycles (241) after the start time of that corresponding memory request timeslot ({220.1, 240.4} through to {220.10, 240.13}), where the value of L is at least 3 and less than the value of T;
all 7 interconnect targets are connected to the first timeslot based interconnect; for each interconnect master I of the M interconnect masters (A, B, C, D, E, F, G):
each interconnect master I is connected to the first timeslot based interconnect;
in which each of the T timeslots (220.1, 220.2, 220.3, 220.4, 220.5, 220.6, 220.7) is mappable to a different one of the M interconnect masters (A, B, C, D, E, F, G).

Furthermore, FIG. 5 illustrates that the value of R (which is 7) equals the value of T (which is 7), and each of the T memory transfer request timeslots (220.1, 220.2, 220.3, 220.4, 220.5, 220.6, 220.7) on the first timeslot based interconnect has a corresponding memory transfer response timeslot (240.4, 240.5, 240.6, 240.7, 240.8, 240.9, 240.10) of the same length (1 clock cycle) on that interconnect.

Figure 6:
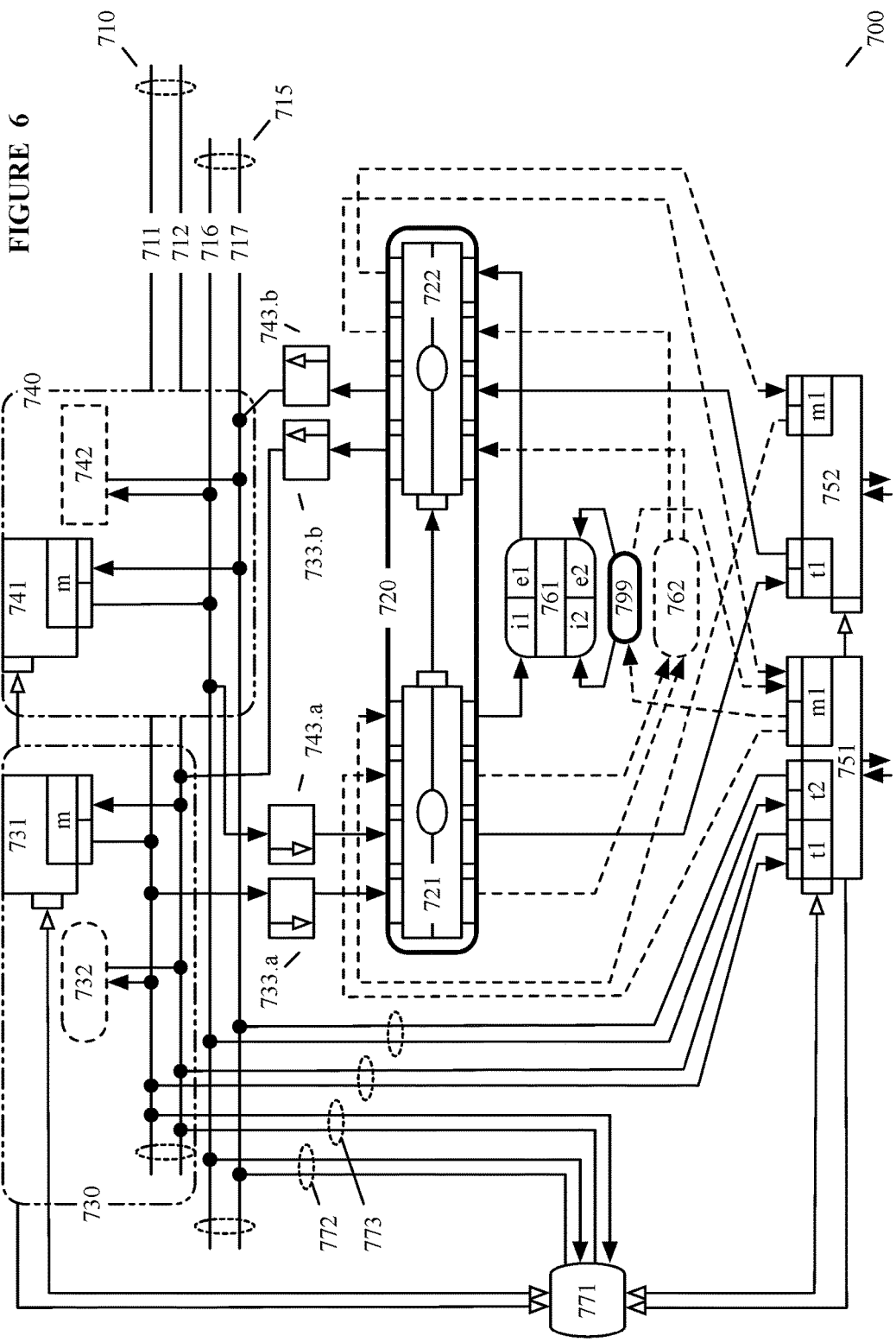
FIG. 6 is a block schematic diagram illustrating preferred embodiments of the present invention.

FIG. 6 is a block schematic diagram illustrating portions of a shared memory computing architecture (700), employing embodiments of FIG. 3 according to a preferred embodiment of the present invention. The shared memory computing architecture (700) comprises:
a first system interconnect (720) of the type described in FIG. 3;
an on-chip random access memory store (761) comprising at least one interconnect target port ({761.$i1$, 761.$e1$}, {761.i1, 761.e1}), in which the first interconnect target port {761.i1, 761.e1} is connected to the first system (720) interconnect;

at least two sub-computing devices (730, 740), in which:
the first (730) of the at least two sub-computing device (730, 740) comprises:
a first local interconnect (710) comprising:
a unidirectional interconnect (711) for transporting memory transfer requests; and
a unidirectional interconnect (712) for transporting the corresponding memory transfer responses;
a first interconnect master (731) connected to a local interconnect (710) of the sub-computing device;
a unidirectional interconnect bridge {733.a, 733.b} comprising two ports, in which:
the first port is connected to the first system interconnect (720); and
the second port is connected to a local interconnect (710) of the sub-computing device; and
in which the first interconnect master (731) is adapted to issue memory transfer requests to the on-chip random access memory store (761) over the unidirectional interconnect bridge {733.a, 733.b}; and
the second (740) of the at least two sub-computing device (730, 740) comprises:
a first local interconnect (715) comprising:
a unidirectional interconnect (716) for transporting memory transfer requests; and
a unidirectional interconnect (717) for transporting the corresponding memory transfer responses;
a first interconnect master (741) connected to a local interconnect (715) of the sub-computing device; and
a unidirectional interconnect bridge {743.a, 743.b} comprising two ports, in which:
the first port is connected to the first system interconnect (720); and
the second port is connected to a local interconnect of the sub-computing device (715); and
in which the first interconnect master (741) is adapted to issue memory transfer requests to the on-chip random access memory store (761) over the unidirectional interconnect bridge {743.a, 743.b}; and
a first peripheral (751), comprising:
a first interconnect target port (751.t1) which is connected to the first local interconnect (710) of the first (730) of the at least two sub-computing devices (730, 740); and
a first interconnect master port (751.m1) which is adapted to issue memory transfer requests to the on-chip random access memory store (761);
in which:
the first interconnect master (731) of the first (730) of the at least two sub-computing devices (730, 740) is adapted to issue memory transfer requests to the first peripheral (751).

The first peripheral (751) of the shared memory computing architecture (700) further comprises:
a second interconnect target port (751.t2) which is connected to the first local interconnect (715) of a second (740) of the at least two sub-computing devices (730, 740); and the first interconnect master (741) of the second (740) of at least two sub-computing devices (730, 740) is adapted to issue memory transfer requests to the first peripheral (751).

The shared memory computing architecture (700) further comprises:
a second peripheral (752), comprising a first interconnect target port (752.t1) which is connected to the first system interconnect (720);
in which the first interconnect master (731, 741) of at least two (730, 740) of the at least two sub-computing devices (730, 740) is adapted to issue memory transfer requests to the second peripheral (752).

The first peripheral (751) of the shared memory computing architecture (700) further comprises a first interconnect master (751.m1) which is adapted to issue memory transfer requests to the on-chip random access memory (761) over the interconnect (720).

The multiprocessor interrupt controller (771) with software maskable interrupt lines is adapted to map one or more interrupt lines between each peripheral (751, 752) and one or more interconnect masters (731, 741). The multiprocessor interrupt controller has a dedicated interconnect target port (772, 773) for each of the at least two sub-computing devices (730, 740).

Preferably, the private memory store (732) is connected as an interconnect target to the local interconnect (710) of the sub-computing device (731).

Preferably, each port of the dual-port time-analysable memory controller and off-chip memory store (762) is connected as a interconnect target to the timeslot based interconnect (720).

Preferably, the timer module (742) has a interconnect target port which is connected to interconnect (715) of the sub-computing device (740) that can generate an interrupt which is exclusively received (not illustrated) by interconnect master (741).

In FIG. 6 the interconnect master (731) can issue memory transfer requests to interconnect target (732) and the interconnect target port (733.a) of the interconnect bridge {733.a, 733.b} to the timeslot based interconnect (720) over interconnect (710). This capability permits scaling of the number of interconnect target devices accessible by the interconnect master (731) in a statically time-analysable manner without increasing the number of time-slots on one or more timeslot based interconnects (720). This also permits frequent, latency sensitive, memory transfer requests from (731) to be serviced by a interconnect target device (732), without incurring multi interconnect master arbitration latency penalties that are present on the timeslot based interconnect (720).

Preferably the first system interconnect (720) is a timeslot based interconnect. A desirable property of connecting the interconnect masters peripherals (751, 752) directly to the timeslot based interconnect (720) is that it becomes trivially easy to calculate the upper-bound latency of their memory transfer requests and the peak bandwidth that can be sustained to the on-chip memory (761).

Preferably, the shared memory computing device (700) of FIG. 6 comprises a means, such as the use of memory management units (not illustrated), to enforce an access control policy that limits which interconnect masters ({733.a, 733.b}, {743.a, 743.b}, 751, 752) can issue memory transfer requests to which interconnect targets ({752.t1}, 761).

In an alternate preferred embodiment, the shared memory computing architecture (700) further comprises a second system interconnect (799) in which:
- the on-chip random access memory store (761) has at least two interconnect target ports ({761.i1, 761.e1}, {761.i2, 761.e2});
- the second interconnect target port {761.i2, 761.e2} of the random access memory store (761) is connected to the second system interconnect (799);
- the first interconnect master port of the first peripheral is disconnected from the first system interconnect (720) and connected to the second system interconnect (799); and
- the first interconnect master port of the second peripheral is disconnected from the first system interconnect (720) and connected (not illustrated) to the second system interconnect (799).

FIG. 7 is a block diagram illustrating a static timeslot schedule (810) with a cycle of 24 fixed timeslots (801 to 824) of 1 clock cycle each that rotate cyclically left (850) by 1 entry every clock cycle for preferred embodiments of the present invention. The 4 interconnect masters (1, 2, 3, 4) are scheduled once every second timeslot (801, 803, 805, . . . ), such that each interconnect master is scheduled once every eight timeslots. For example, interconnect master is scheduled in timeslots (801, 809, 817). The value (illustrated as corresponding to interconnect master 1) in element (825) is used by the arbiter and decoder module to control which interconnect master is granted access to a given timeslot based interconnect. The 12 interconnect master peripherals (5, 6, 7, 8, 9, 10, 11, 12, 13, 14, 15, 16) are scheduled one every second timeslot, such that each of those 12 interconnect master peripherals is scheduled once every 24 timeslots. In this way, the 4 interconnect masters (1, 2, 3, 4) are granted higher-frequency access, and thus proportionally more bandwidth, than the other 12 interconnect master peripherals. This particular scheduling scheme is well suited to managing 4 processor cores along with 12 interconnect master peripherals on one timeslot based interconnect, such as interconnect (720) of FIG. 6. Clearly each interconnect master peripheral (5, 6, 7, 8, 9, 10, 11, 12, 13, 14, 15, 16) must be able to buffer data to write without loss for up to 24 clock cycles.

FIG. 8 is a block diagram that illustrates a least recently granted (LRG) interconnect master scheme with 16 timeslots of 1 clock cycle each according to preferred embodiment of the present invention. Region (860) illustrates the value of the 16 timeslots (861 to 876) in the first clock cycle and region (880) illustrates the value of the same 16 timeslots (881 to 896) in the second clock cycle. The LRG scheme ensures that if all 16 interconnect masters are concurrently issuing memory transfer request at an equal rate, then each interconnect master is granted equal number of timeslots to the interconnect. On the other hand, if less than 16 interconnect masters are concurrently issuing memory transfer requests, then the available bandwidth is opportunistically allocated to the active interconnect masters. In FIG. 8, at the start of the first clock-cycle (860) interconnect masters 4 (864), 9 (869), 10 (870), and 12 (872) have issued memory transfer requests and are waiting to be granted on the timeslot based interconnect. In this case, the least recently granted interconnect master was interconnect master 12 (872), and that interconnect master is granted access to the current timeslot on the timeslot based interconnect. At the start of the next clock cycle (860), interconnect master 12 (881) is placed at the start of the queue, interconnect masters 1 to 11 (861, . . . , 871) age by one clock cycle (862, . . . , 892), and interconnect master 6 (886) issues a memory transfer request to the timeslot based interconnect. In this clock cycle (880), the least recently granted interconnect master with a pending memory transfer request is 10 (891), and it is granted access to the current timeslot of the timeslot based interconnect.

In a further preferred embodiment of the present invention, a rate limiting counter is associated with each of the 16 interconnect masters, for example counter (897) for interconnect master 12 (881). The rate limiting counter decreases by one each clock cycle, stopping at zero. When the timeslot based interconnect is reset, each interconnect master is assigned a value indicating how many clock cycles must pass before that interconnect master may be granted the timeslot based interconnect by the arbiter after having completed a memory transfer request. This rate-limiting capability can be used to reduce power consumption (by reducing the number of reads and/or writes to the shared memory store) and to ensure higher-bandwidth or higher-frequency devices have greater opportunity to be granted the timeslot based interconnect.

Figure 9:
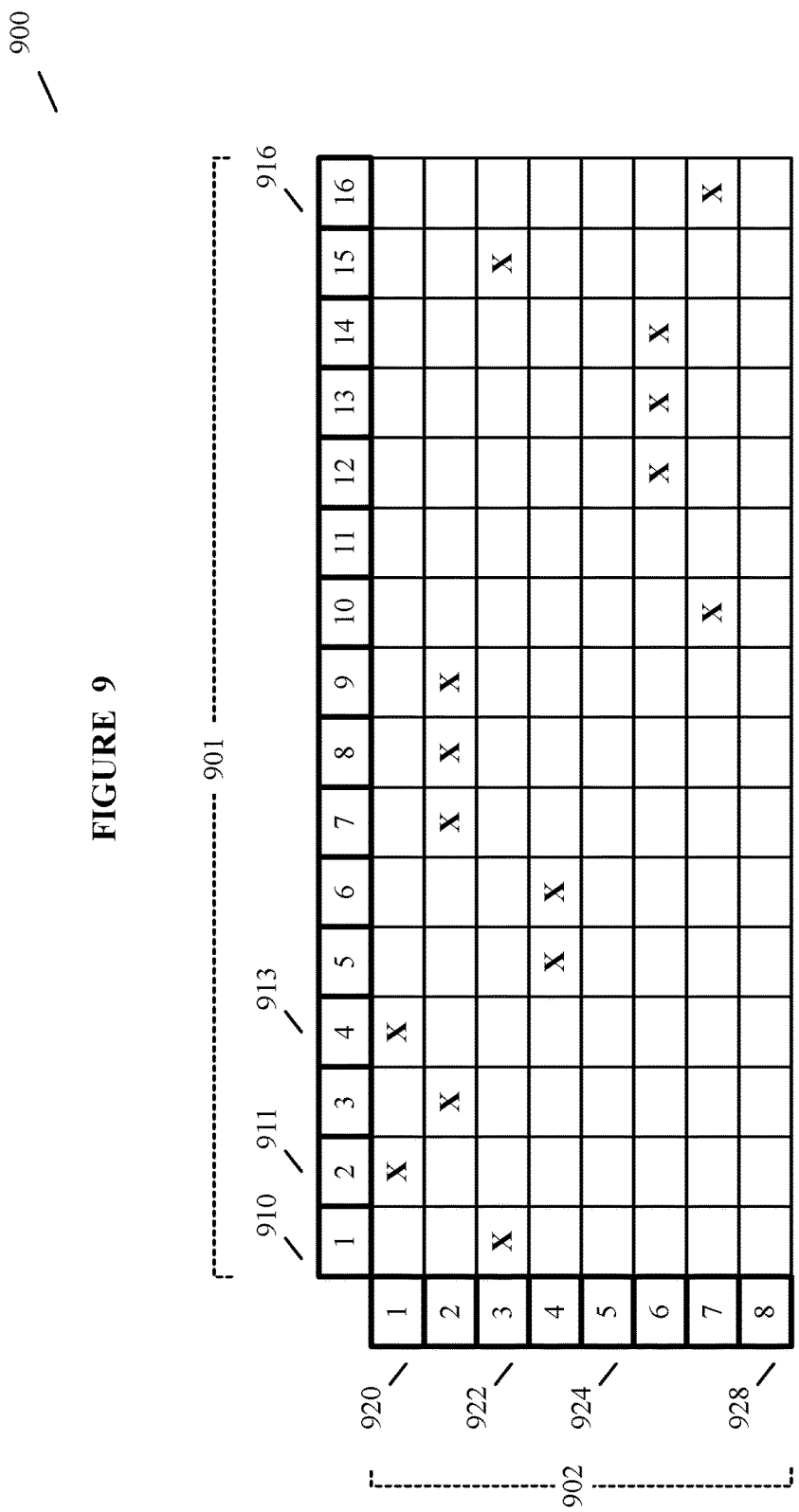
FIG. 9 is an access control list diagram according to embodiments of the type of FIG. 3.

FIG. 9 is a table illustrating an access control list (ACL) (900) for 8 interconnect masters (902) and 16 interconnect targets (901) connected to a timeslot based interconnect, for preferred embodiments of the present invention. The label 'X' illustrates that a specific interconnect master may access a specific interconnect target, where its absence indicates prohibition of access.

FIG. 9 illustrates an access control list policy (900) in which that ACL policy has been configured in such a way that no more than one interconnect master can issue memory transfer requests to a given interconnect target on that timeslot based interconnect. For example the first interconnect target (910) may only be accessed by the third interconnect master (922) as illustrated by the label 'X' (in column 1, row 3) and its absence in every other column of row 3. An interconnect master may be permitted by the ACL policy to access more than one interconnect target. For example the first interconnect master (920) is permitted to issue memory transfer requests to the second (911) and fourth (913) interconnect targets. Furthermore, an interconnect master may not be permitted to issue memory transfer requests to any interconnect target peripherals on that interconnect, as illustrated by the row five of the table for the fifth interconnect master (924).

FIG. 9 can be encoded as a 1 dimensional array of 64-bits in length, partitioned into 16 elements (one for each interconnect target), each element being 4-bits in length and indicating which one of the up to 16 interconnect masters may access it.

Preferably, the ACL policy is adapted to be dynamically adjusted at run-time by supervisor software, such as a hypervisor or operating system, in response to the set of currently active tasks. Preferably there are two levels of ACL policy. A first ACL policy specifying which set of interconnect masters are permitted to be mapped to any given interconnect target, and a second ACL policy that selects which (if any) one of those interconnect masters is currently assigned to any given interconnect target. This then permits a system-level supervisory software to set system level ACL constraints, while permitting each sub-computing device to independently select a valid ACL configuration from the permissible sub-set of all possible configurations for that sub-computing device.

Figure 10:
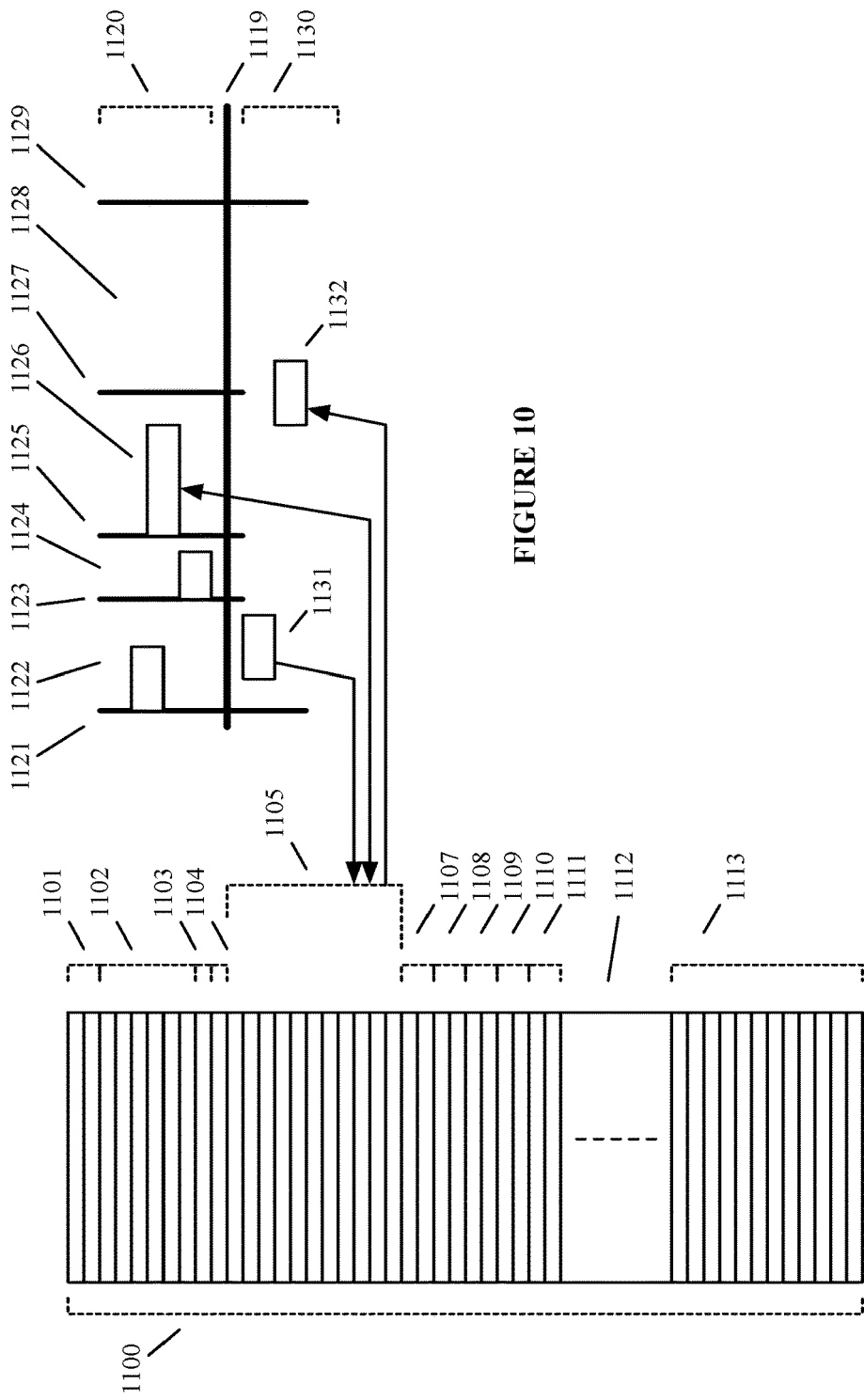
FIG. 10 is a hybrid block schematic diagram illustrating the allocation of memory, and the timing of interconnect masters access that memory according to embodiments of the type of FIG. 3 and FIG. 6.

FIG. 10 is a hybrid block schematic diagram illustrating the allocation/partitioning (1100) of memory ((761) of FIG. 6), and the timing of interconnect masters, specifically software tasks (1120) running on processor cores and peripherals (1130), accessing that memory ((761) of FIG. 6) according to embodiments of the type of FIG. 3 and FIG. 6. In this illustration the width of the timeslot based interconnect ((720) of FIG. 6) is 1024 bits in length, and each of the elements of memory in memory store (761) is also 1024 bits in length.

Logical partition 1101 illustrates two elements of memory store (761) allocated to store the content of a network packet for a peripheral that performs operations on 2048-bit long packets. Logical partition (1102) shows 6 elements of memory store (761) allocated for use by memory transfer requests issued by at least one interconnect master port of that peripheral. Logical partitions (1103) and (1104) are allocated 2 elements of memory store (761) which are used as end-of-queue buffers, so that while one packet is being written into one of the two logical partitions, the other packet in the other logical partition is being transferred to an independent (possibly off-chip) memory. This permits the head-of-queue packets to be stored in SRAM store (761) while still having buffers allocated for receiving and off-loading packets as they arrive from that peripheral to an independent memory.

Logical partition (1105) illustrates 12 elements of memory assigned to 12 time-slots of a time-triggered protocol with variable length time-slots of up to 1024-bits in length.

Logical partitions (1107, 1108, 1109, 1110, 1111) are assigned to a single network peripheral that has 5 virtual ports. Each of those 5 logical partitions may be assigned exclusively to a different processor core and/or operating system instance and/or communications session. In preferred embodiments of the present invention the number of virtual queues, and the length of each virtual queue assigned to a peripheral is dynamically set at boot up, and those preferences are communicated to the peripheral over its interconnect target port, or a partition in (1100) storing configuration data.

Logical partition (1112) is left unallocated.

Logical partition (1113) is allocated for sending and receiving messages between two RTOS instances running on a first processor core and a second processor core. Preferably, the two RTOS instances are configured to further sub-partition that space.

Timeline 1119 illustrates four ({1121, 1123}, {1123, 1125}, {1125, 1127}, {1127, 1229}) time and space (T&S) partitions for software tasks (1122, 1124, 1126) illustrated in region (1120). A first task (1122) operates in the first T&S partition {1121, 1132} on processor core (731), a second task (1124) operates in a second T&S partition on processor core (731), a third task (1126) operates in a third T&S partition on processor core (731). With regard to peripheral activity (1130), a peripheral (752 of FIG. 6) receives a packet transmitted to it over a public wide-area network, and writes that packet into partition (1105). Due to unknown latencies introduced at run time by competing traffic over the public wide-area network, it is not possible to accurately predict at what time that packet will arrive. That packet is processed by the task (1126) in the third T&S partition, and a new packet of data is generated by that task (1126) and written into partition (1105). The interconnect master port of that peripheral (752) accesses the partition (1105) to retrieve that new packet so that it can be transmitted over the wide area network. The tasks (1122, 1124, 1126) all access memory (1100) during their designated time-slots.

Advantageously, when the timeslot based interconnect (720) is running a fixed time-slot scheduling scheme, the reception (1131) and transmission (1132) of packets results in no unwanted/uncontrolled timing interference for the memory transfer requests issued by processor core (731) to (732). As there is no uncontrolled timing interference, static worst case execution time analysis of tasks running on core (731) can be achieved with tighter bounds than with the conventional multi-core architectures in which multiple processor cores and interconnect master peripherals are permitted work-preserving access to SDRAM. When the timeslot based interconnect is running in a least recently granted interconnect master mode without rate limiters, the timing interference is upper bound to the equivalent of a static timeslot scheduling scheme with one timeslot per interconnect master.

Advantageously, the 1024-bit wide SRAM (720) offers exceptionally high bandwidth when compared to a 64-bit wide double-data-rate off-chip SDRAM channel operating at comparable clock-speeds. It is possible to use the relatively high aggregate bandwidth of the SRAM (720) to ensure that every peripheral has sufficient bandwidth to operate at its (off-chip I/O) wire-speed, even in a static timeslot scheduled environment servicing multiple interconnect masters. This approach tends to significantly increase the total effective usable memory bandwidth within a computing device. For example, in many cases, a packet sent or received by a peripheral may not ever have to be written to the relatively low-bandwidth off-chip memory store.

Figure 11:
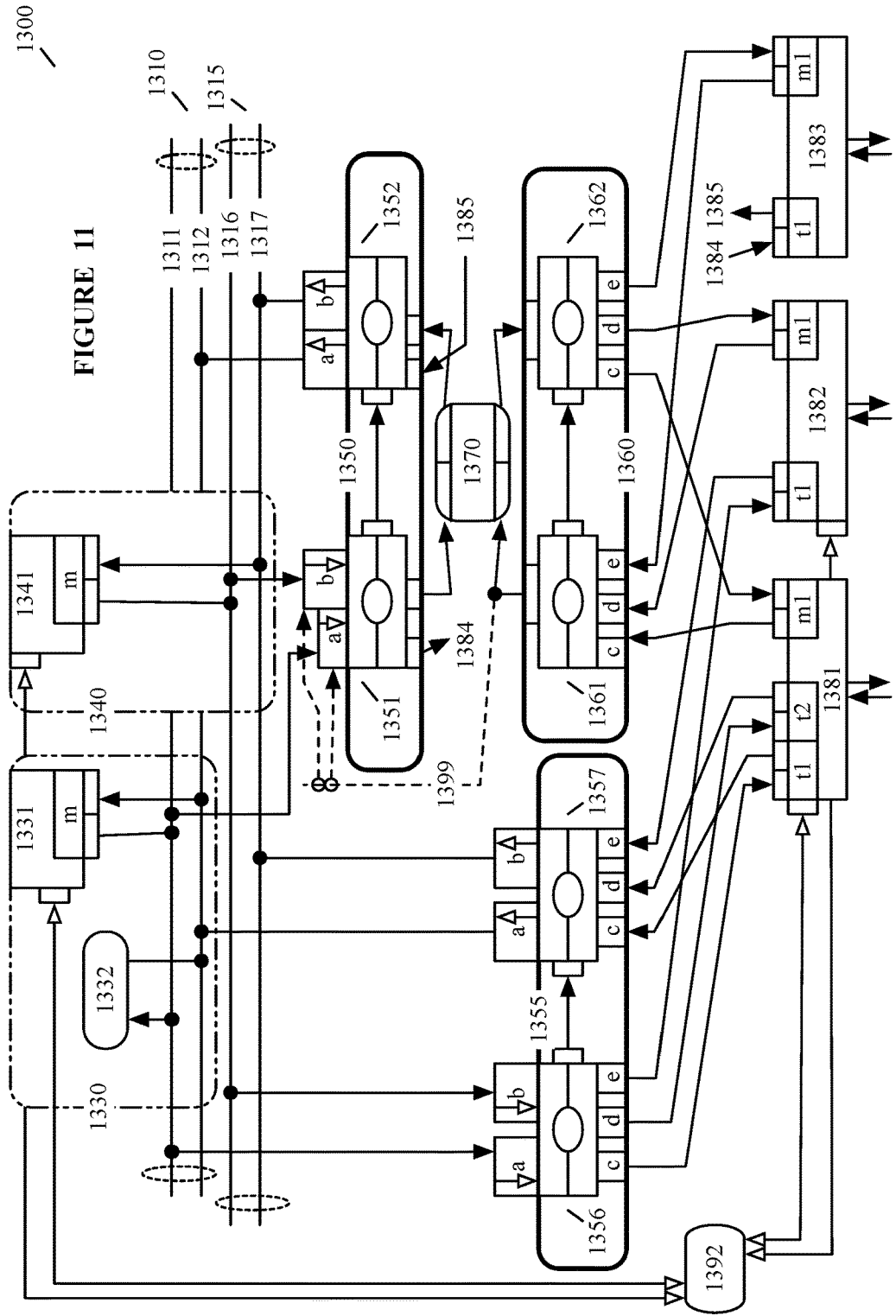
FIG. 11 is a block schematic diagram illustrating portions of the embodiments of FIGS. 1 and 3.

FIG. 11 is a block schematic diagram illustrating portions of a shared memory computing architecture (1300) optimised for upper-bound worst case execution time, employing embodiments of FIGS. 1 and 3 according to a preferred embodiment of the present invention. The shared memory computing architecture (1300) comprises:

a first system interconnect (1350) of the type described in FIG. 1;

an on-chip random access memory store (1370) comprising two interconnect target ports, in which the first interconnect target port is connected to the first system (1350) interconnect;

at least two sub-computing device (1330, 1340), in which:
the first (1330) of the at least two sub-computing devices (1330, 1340) comprises:
a first local interconnect (1310) comprising:
a unidirectional interconnect (1311) for transporting memory transfer requests; and
a unidirectional interconnect (1312) for transporting the corresponding memory transfer responses;
a first interconnect master (1331) connected to a local interconnect (1310) of the sub-computing device;
a unidirectional interconnect bridge {1351.*a*, 1352*a*} comprising two ports, in which:
the first port is connected to the first system interconnect (1350); and
the second port is connected to a local interconnect (1310) of the sub-computing device; and
in which the first interconnect master (1331) is adapted to issue memory transfer requests to the on-chip random access memory store (1370) over the unidirectional interconnect bridge {1351.*a*, 1352.*a*};
the second (1340) of the at least two sub-computing devices (1330, 1340) comprises:
a first local interconnect (1315) comprising:
a unidirectional interconnect (1316) for transporting memory transfer requests; and a unidirectional interconnect (1317) for transporting the corresponding memory transfer responses;

a first interconnect master (1341) connected to a local interconnect (1315) of the sub-computing device; and a unidirectional interconnect bridge {1351.*b*, 1352.*b*} comprising two ports, in which:

the first port is connected to the first system interconnect (1370); and the second port is connected to a local interconnect of the sub-computing device (1315); and in which the first interconnect master (1341) is adapted to issue memory transfer requests to the on-chip random access memory store (1370) over the unidirectional interconnect bridge {1351.*b*, 1352.*b*}.

The shared memory computing architecture (1300) further comprises:

an on-chip random access memory store (1370) comprising at least two interconnect target ports, in which:

the first port:

has a data path of D-bits in width, the value of D being equal to 128;

is adapted to sustain a throughput of one D-bit wide memory transfer request per clock cycle; and is adapted to sustain a throughput of one D-bit wide memory transfer response per clock cycle; and the second port:

has a data path of E-bits in width, the value of E being equal to 16;

is adapted to sustain a throughput of one E-bit wide memory transfer request per clock cycle; and is adapted to sustain a throughput of one E-bit wide memory transfer response per clock cycle;

a first on-chip shared memory interconnect (1350) of the type described in FIG. 1 which:

has a data path of D-bits in width;

is exclusively connected to the first port of the at least two interconnect target ports of the on-chip random access memory (1370);

is adapted to sustain a throughput of one D-bit wide memory transfer request per clock cycle to the on-chip random access memory (1370);

is adapted to sustain a throughput of one D-bit wide memory transfer response per clock cycle; and has at least two cache modules ({1351.*a*, 1352.*a*}, {1351.*b*, 1352.*b*}) connected to it, each cache module comprising:

a master port with a D-bit wide data path which is connected to this interconnect (1350); and a target port;

and a second on-chip shared memory interconnect (1360) of the type described in FIG. 1 which:

has a data path of E-bits in width;

is exclusively connected to the second port of the at least two interconnect target ports of the on-chip random access memory (1370);

is adapted to sustain a peak throughput of one E-bit wide memory transfer request per clock cycle to the on-chip random access memory (1370); and is adapted to sustain a peak throughput of one E-bit wide memory transfer response per clock cycle; and has at least two interconnect masters (1381, 1382) connected to it.

Preferably the dual-port on-chip random access store (1370) is internally comprised of 8 dual-port 16-bit wide on-chip random access stores arranged in parallel. The first port is adapted to receive memory transfer requests with data lengths ranging from 16 to 128-bits in length, in multiples of 16 bits. The second part is adapted to receive 16 bit memory transfer requests. This configuration is well suited to cost effectively creating a memory store that can sustain the wire-speed bandwidth requirements of a relatively large number of lower bandwidth peripherals while permitting interconnect masters (1331) and (1341) relatively high bandwidth low-latency access to that data.

In an alternate preferred embodiment of the present invention, the value of D is equal to 256 and the value of E is equal to 256 and the dual-port on-chip random access store (1370) is internally comprised of 16 dual-port 32-bit wide on-chip random access stores arranged in parallel. This configuration is well suited to supporting the wire speed of higher bandwidth peripherals.

Preferably both the first (1350) and second (1360) on-chip shared memory interconnects employ timeslot based arbitration schemes; and at least two timeslots of the first on-chip shared memory interconnect each have a timeslot length of one clock cycle in length.

It is further preferred that both interconnects (1350) and (1360) only employ timeslots that have a duration of 1 clock cycle in length, and in which the data-path width is adapted so that it is sufficiently wide to transmit an entire memory transfer request and/or its corresponding memory transfer response in 1 clock cycle. This later configuration is particularly desirable, when compared against a configuration in which both interconnects employ timeslots of 2 clock cycles, a configuration which would double the worst case access latency for an interconnect master directly connected to the interconnect seeking to gain access to a timeslot. To place this result in context, several commercial off the shelf average case execution time optimised multi-core computer architectures employ bus protocols, such as AMBA AHB 2, which permit memory transfer requests to block the bus for well over 10 clock cycles.

This later configuration, in which each timeslot is 1 clock cycle in length, is extremely desirable even if one or more of the interconnect masters can not sustain high rates of memory transfer requests. This is because this configuration achieves the lowest worst case access latencies at the point of contention between interconnect masters.

The computing architecture (1300) further comprises:

at least one processor core (1331, 1341);

a peripheral (1383), comprising:

a first interconnect target port (1381.*t*1) which is connected by wires (1384, 1385) to the first on-chip shared memory interconnect (1350); and a first interconnect master port (1381.*m*1) which is connected to the second on-chip shared memory interconnect (1360);

in which:

at least one (1331, 1341) of the at least one processor cores (1331, 1341) can issue a memory transfer request over the first on-chip shared memory interconnect (1350) to the peripheral (1383);

the peripheral (1383) can store data in the on-chip random access memory over the second system interconnect (1360); and to the at least one (1331, 1341) of the at least one processor cores (1331, 1341) can read that data.

The computing architecture (1300) further comprises:

a first peripheral interconnect (1355) of the type described in FIG. 3 for transporting memory transfer requests and their corresponding responses;

a peripheral (1381), comprising:
- a first interconnect target port (1381.*t*1) which is connected to the first peripheral interconnect (1355);
- a second interconnect target port (1381.*t*2) which is connected to the first peripheral interconnect (1355); and
- a first interconnect master port (1381.*m*1) which is connected to one (1360) of the at least two on-chip shared memory interconnects (1350, 1360);

in which:
- at least one of the at least one processor cores (1331, 1341) can issue a memory transfer request over the first peripheral interconnect (1355) to the peripheral (1381);
- the peripheral (1381) can store data in the on-chip random access memory (1370) over the second system interconnect (1360); and
- the at least one of the at least one processor cores (1331, 1341) can read that data.

Preferably the peripheral interconnect is adapted to transport each memory transfer request in 1 clock cycle and each corresponding memory transfer response in 1 clock cycle. Preferably the data-path width of the peripheral interconnect (1355) is less than the data-path width of the second interconnect (1350, 1360).

Preferably there is a second peripheral interconnect (not illustrated) adapted to enable the processor cores (1331, 1341) to communicate with peripherals that do not have an interconnect master interface. The use of a second peripheral interconnect for peripherals that do not have interconnect master interfaces is particularly advantageous because it permits many relatively low bandwidth peripherals to be placed and routed on the chip some distance away from the memory store (1370) which is used by relatively high bandwidth interconnect-master peripherals.

The computing architecture (1300) further comprises:
a peripheral (1382), comprising:
- a first interconnect target port (1382.*t*1) which is connected to the first peripheral interconnect (1355);
- a first interconnect master port (1382.*m*1) which is connected to one (1360) of the at least two on-chip shared memory interconnects;

in which:
- at least one of the at least one processor cores (1331, 1341) can issue a memory transfer request over the first peripheral interconnect (1355) to the peripheral (1381);
- the peripheral (1381) can store data in the on-chip random access memory (1370) over the second system interconnect (1360); and
- the at least one of the at least one processor cores (1331, 1341) can read that data.

Preferably the two interconnect bridges ({1351.*a*, 1352.*a*}, {1351.*b*, 1352.*b*}) are cache modules. The use of cache modules is highly desirable as it permits interconnect masters with relatively narrow data path widths, such as 32-bit processor cores (1331, 1341), to take better advantage of interconnects (1350) and shared on-chip memories (1370) with relatively wide data paths (e.g. 128-bit). For example, if there are sixteen 32-bit processor cores, in which each core has a private cache module that is attached to the same interconnect (1350), increasing the data-path width of that interconnect (1350) from 128-bit to 512-bit or higher increases the amount of data prefetched by read memory transfer requests issued by each cache module to that interconnect (1350). This in turn tends to result in improved masking of the worst case 16 clock cycle access latencies between 2 consecutive memory transfer requests issued by a cache module to that shared memory (1370) over that interconnect (1350) for that caches' processor core.

Preferably at least 2 of the at least 2 cache modules ({1351.*a*, 1352.*a*}, {1351.*b*, 1352.*b*}) which are connected to the first on-chip shared memory interconnect (1350) maintain cache-coherency with each other ({1351.*a*, 1352.*a*}, {1351.*b*, 1352.*b*}) with zero timing interference to unrelated memory transfer requests received on the target Port of those at least 2 cache modules ({1351.*a*, 1352.*a*}, {1351.*b*, 1352.*b*}). These properties simplify the worst case execution time analysis of tasks running on cores (1331, 1341) that access their private cache modules (({1351.*a*, 1352.*a*}, {1351.*b*, 1352.*b*}).

Preferably at least 2 of the at least 2 cache modules ({1351.*a*, 1352.*a*}, {1351.*b*, 1352.*b*}) which are connected to the first on-chip shared memory interconnect (1350) operate in a cache-coherency group that maintains cache-coherency between each other and also maintains cache coherency against the write memory transfer requests (1399) issued to at least one of the other ports of the on-chip random access memory (1370). For example in a 16 core system (1331, 1341, . . . ) with 64 interconnect-master peripherals (1381, 1382, 1383, . . . ), a cache-coherency group could include 2 out of 16 processor cores, and 10 out of 64 interconnect-master peripherals. This reduces the upper-bound rate of cache coherency traffic that must be processed by the cache modules for those 2 cores, resulting in significant power savings and lower-cost address look-up mechanisms in the cache modules. e.g. this cache coherency group would only need to sustain looking up to 12 memory transfer requests every 16 clock cycles instead of looking up to 32 memory transfer requests every 16 clock cycles.

Preferably at least 2 of the at least 2 cache modules ({1351.*a*, 1352.*a*}, {1351.*b*, 1352.*b*}) which are connected to the first on-chip shared memory interconnect (1350) operate in a cache-coherency group that maintains cache-coherency between each other are update type of caches that snarf each others write requests. This is particularly advantageous when performing worst case execution time (WET) analysis of tightly coupled tasks in shared memory architectures. Let us consider the situation in which the first core (1341) requests a resource lock and the second core (1331) releases that same resource lock. The cache snarfing mechanisms can be adapted to guarantee that all write requests issued by the core (1341) before that core (1341) released the resource lock are processed by the snarfing cache of core (1331) before that core (1331) is granted that shared resource lock. This ensures that each cache-line that was present in the cache of core (1331) before that core (1331) requested a shared memory resource lock are coherent with the write memory transfer requests issued by core (1341). This then avoids the need to consider which cache-lines, if any, were updated by other tasks running on other cores in the cache coherency group that are sharing a common region of memory. This can result in a very significant reduction in upper-bound WCET analysis complexity. It can also result in tighter upper-bound WCET analysis times for those tasks. By way of comparison, the use of an eviction type of cache would result in some cache-lines that were present in the cache of core (1331) before the resource lock was requested being evicted so as to maintain coherency with the write memory transfer requests of core (1341). This would require the upper-bound WCET analysis tools to identify which cache-lines could potentially have been evicted so as to make pessimistic timing assumptions about access to those cache-lines.

The use of on-chip dual port memory (1370) is particularly well suited for supporting a relatively low number of high-bandwidth bus masters such as processor cores (1331, 1341) connected to the first interconnect (1350), and a larger number of peripherals (for example, 64 peripherals) operating at their wire speed which are connected to the second interconnect (1360). In particular, increasing the number of peripherals, say from 64 to 128, does not reduce the bandwidth, or increase the access latencies of processor cores (1331), (1341) to the shared memory (1370). Furthermore, one or more timeslots of the second interconnect (1360) can be allocated to high bandwidth peripherals (say 1 gigabit/s Ethernet peripherals) over lower bandwidth peripherals (say 10 Megabit/s Ethernet peripherals) which need only be allocated one timeslot to meet their wire speed bandwidth requirements.

In some situations, it will be desirable for one or more of the M interconnect bridges ({1351.a, 1252.a}, {1351.b, 1252.b}) to operate as an interconnect protocol transcoding bridge in which the protocol to transcode is a bus interconnect protocol such as ARM AMBA AHB [2].

The time-analysable multiprocessor interrupt controller (1392) with software maskable interrupt lines is adapted to map one or more interrupt lines between the peripherals (1381, 1382) and one or more interconnect masters (1331, 1341).

The shared memory computing device (1300) further comprises:
N cache modules ({1351.a, 1352.a}, {1351.b, 1352.b}), where the value of N is 2, each cache module comprising:
  a master port:
  a target port; and
  a finite state machine that employs an update-type cache coherency policy;
N processor cores (1331, 1341), in which each core:
  is assigned a different one of the N fully associative cache modules ({1351.a, 1352.a}, {1351.b, 1352.b}) as its private cache; and
in which:
  the execution time of memory transfer requests issued by each of the N processor cores (1331, 1341) is not modified by the:
    unrelated memory transfer requests issued by any of the other N processor cores (1331, 1341); and
    unrelated memory transfer requests issued by at least one other interconnect master (1381, 1382, 1383);
  one {1351.a, 1352.a} of the N cache modules ({1351.a, 1352.a}, {1351.b, 1352.b}) can maintain cache coherency against a different one of the N cache modules {1351.b, 1352.b}; and
  that cache module {1351.a, 1352.a} can maintain cache coherency against memory transfer requests issued by the at least one interconnect master (1381, 1382, 1383) by monitoring wire (1399).

Figure 12:
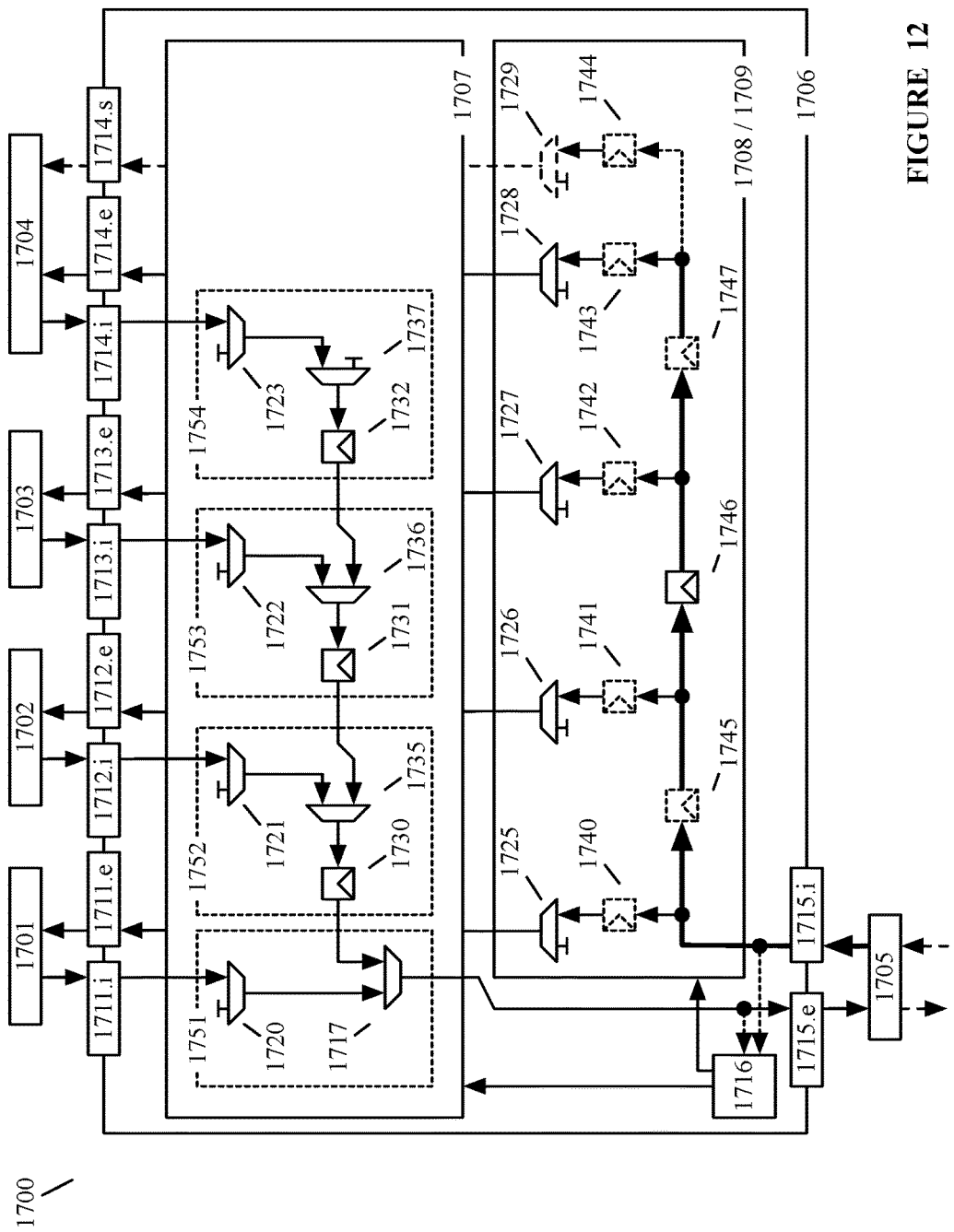
FIG. 12 is a block schematic diagram illustrating preferred embodiments of the present invention.
Figure 13:
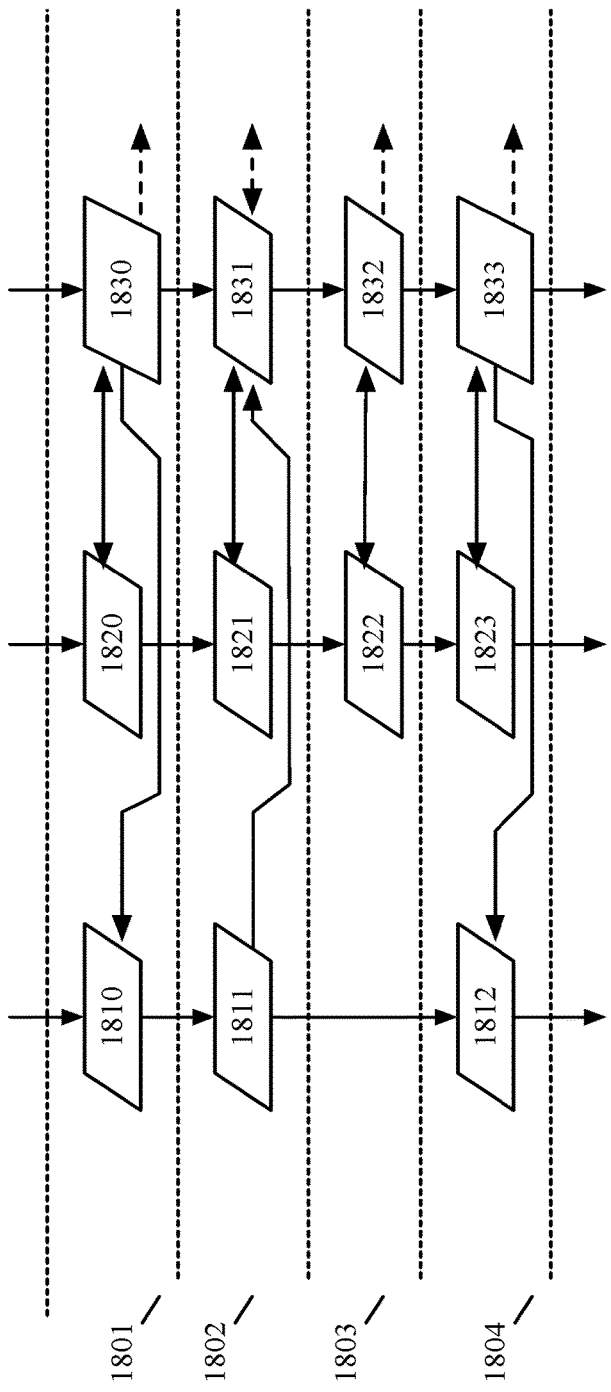
FIG. 13 is a flow-chart illustrating processes of according to the embodiments of FIG. 12.
Figure 14:
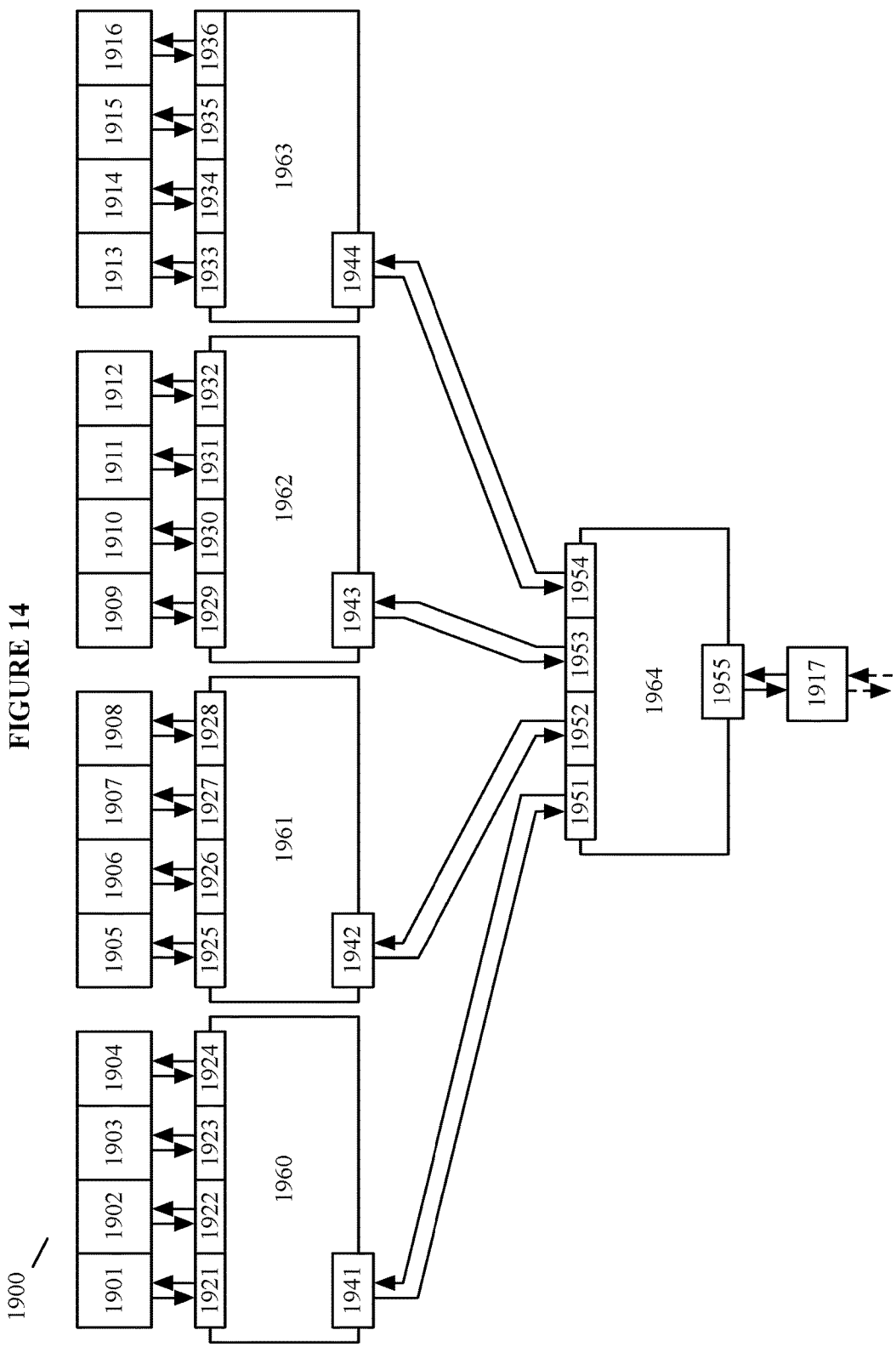
FIG. 14 is a block schematic diagram illustrating portions of the embodiments of FIGS. 3 and 12.

FIGS. 12 to 14 illustrate alternative interconnect designs according to preferred embodiments of the present invention. These alternative interconnect designs can be employed to implement the interconnect (720) of FIG. 6 and the 3 interconnects (1350), (1360) and (1355) of FIG. 11.

FIG. 12 is a block schematic diagram illustrating portions of a shared memory computing architecture (1700) for preferred embodiments of the present invention. The shared memory computing architecture (1700), comprises:

M interconnect nodes (1701, 1702, 1703, 1704), where the value of M is 4, each interconnect node comprising:
  an egress port; and
  an ingress port;
a singular interconnect node (1705) comprising:
  an egress port; and
  an ingress port;
a first M×1 interconnect (1706) for transporting memory transfer requests and their corresponding responses, comprising:
  M bidirectional ports ({1711.i, 1711.e}, {1712.i, 1712.e}, {1713.i, 1713.e}, {1714.i, 1714.e}), each comprising:
    an ingress port (1711.i, 1712.i, 1713.i, 1714.i) which is connected to the egress port of a different one of the M interconnect nodes (1701, 1702, 1703, 1704); and
    an egress port (1711.e, 1712.e, 1713.e, 1714.e), which is connected to the ingress port of a different one of the M interconnect nodes (1701, 1702, 1703, 1704);
  a singular bidirectional port ({1715.i, 1715.e}) comprising:
    an egress port (1715.e) which is connected to the ingress port of the singular interconnect node (1705); and
    an ingress port (1715.i) which is connected to the egress port of the singular interconnect node (1705);
  a parallel-in, serial-out (PISO) M input port×1 output port shift register (1707) with M stages (1751, 1752, 1753, 1754), in which:
    for each stage I of the M stages: that stage is connected to the egress port of the interconnect node I of M interconnect nodes ({1751, 1711.i, 1701}, {1752, 1712.i, 1702}, {1753, 1713.i, 1703}, {1754, 1714.i, 1704}); and
    the output of stage 1 (1751) is connected to the egress port (1715.e) of the singular port of the interconnect;
  a serial-in, parallel-out (SIPO) 1 input port×M output port module (1708), in which the input is connected to the ingress port of the singular port of the interconnect (1715.i); and
  an arbiter and decoder module (1716) which is adapted to control the PISO M×1 shift register (1707) and the SIPO 1×M module (1708).

In this pedagogical description, the value of W is set as the number of bits to transport a memory transfer request of the maximum length for that interconnect and its corresponding response in one clock cycle. An idle memory transfer request is encoded as W bits with the binary value of zero. The arbiter and decoder module (1716) controls: the select input of each of the 2 data input, 1 data output multiplexers (1720, 1721, 1272, 1723, 1725, 1726, 1727, 1728), each multiplexer having a data-path of W bits; the select input of the optional 2 data input, 1 data output multiplexer (1729) which has a data-path of W bits; the enable input of each of the registers (1730, 1731, 1732), each register having a data-path of W bits; the enable input of each of the optional registers (1740, 1741, 1742, 1743, 1744), each register having a data-path of W bits; the enable input of register (1746) which has a data-path of W bits, the enable input of each of the optional registers (1745, 1747), each register having a data-path of W bits.

The interconnect arbiter and decoder module (1716) receives as inputs the control signals (not illustrated)

received on ports (1711.*i*, 1712.*i*, 1713.*i*, 1714.*i*, 1715.*i*). Preferably the arbiter and decoder module (1716) implements at least one scheduling policy that considers the state of those input control signals.

The interconnect arbiter and decoder module (1716) generates one or more control signals as outputs (not illustrated) that are supplied as output on ports (1711.*e*, 1712.*e*, 1713.*e*, 1714.*e*, 1715.*e*). One or more of these controls signals released as output on ports (1711.*e*, 1712.*e*, 1713.*e*, 1714.*e*, 1715.*e*) are used to inform the interconnect nodes (1701, 1702, 1703, 1704, 1705) if it has been granted a timeslot on the interconnect to issue a memory transfer request (if it is a interconnect master); and to provide relevant meta-data associated with a memory transfer request sent to that interconnect node (if it is a interconnect target).

The following text employs the use of the optional registers (1740, 1741, 1742) and the optional registers (1745, 1747).

This paragraph describes the parallel-in, serial-out (PISO) M input port×1 output port shift register module (1707) in greater detail. The data-path of each of the ingress ports (1711.*i*, 1712.*i*, 1713.*i*, 1714.*i*) is gated by the multiplexers (1720, 1721, 1722, 1723) respectively. The data path of each of the egress ports of (1711.*e*, 1712.*e*, 1713.*e*, 1714.*e*, 1714.*s*) is gated by the multiplexers (1725, 1726, 1727, 1728, 1729) respectively. In the fourth stage (1754) of the parallel-in, serial-out (PISO) M input port×1 output port shift register (1707), the binary value 0 is supplied as input to the first data port of multiplexer (1737). The output of multiplexer (1723) is supplied as input to the second data port of multiplexer (1737). The output of multiplexer (1737) is supplied as data input to the register (1732). In the third stage (1753), the output of register (1732) is supplied as input to the first data port of multiplexer (1736). The output of multiplexer (1722) is supplied as input to the second data port of multiplexer (1736). The output of multiplexer (1736) is supplied as data input to the register (1731). In the second stage (1752), the output of register (1731) is supplied as input to the first data port of multiplexer (1735). The output of multiplexer (1721) is supplied as input to the second data port of multiplexer (1735). The output of multiplexer (1735) is supplied as data input to the register (1730). In the first stage (1753), the output of register (1730) is supplied as input to the first data port of multiplexer (1717). The output of multiplexer (1720) is supplied as input to the second data port of multiplexer (1717). The output of multiplexer (1717) is released as the egress output of port (1715.*e*).

This paragraph describes the serial-in, parallel-out (SIPO) 1 input port×M output port module (1708) in greater detail. The output of interconnect node (1705) is received on ingress port (1715.*i*) and is supplied to the data input of registers (1740) and (1745). The output of the W-bit wide register (1740) is gated by multiplexer (1725). The output of W-bit wide register (1745) is supplied to the data input of registers (1741) and (1746). The output of the W-bit wide register (1741) is gated by multiplexer (1726). The output of W-bit wide register (1746) is supplied to the data input of registers (1742) and (1747). The output of the W-bit wide register (1742) is gated by multiplexer (1727). The output of W-bit wide register (1747) is supplied is gated by multiplexer (1728).

Preferably the arbiter and decoder module (1716) is adapted to employ the ingress and egress gating to selectively block the outputs and inputs of interconnect nodes (1701, 1702, 1703, 1704) respectively. Furthermore, the gating multiplexers can be used by the arbiter and decoder module (1716) to enforce access controls. The gating multiplexers can be implemented using AND gates without loss of generality.

In a preferred embodiment of the present invention, the interconnect node (1705) is an interconnect master, and the interconnect nodes (1701, 1702, 1703, 1704) are interconnect targets. In this embodiment, memory transfer requests are transported over the first serial-in, parallel-out (SIPO) 1 input port×M output port module (1708) and memory transfer responses are transported over the parallel-in, serial-out (PISO) M input port×1 output port shift register module (1707). Preferably each timeslot has a length of 1 clock cycle, interconnect master (1705) is adapted to issue a new memory transfer request every clock cycle and each interconnect target (1701, 1702, 1703, 1704) is adapted to issue a memory transfer response once every 4 clock cycles.

Preferably each interconnect target (1701, 1702, 1703, 1704) is assigned one timeslot, and the interconnect master issues memory transfer requests in a round-robin fashion to each of the interconnect targets (1701, 1702, 1703, 1704). In a preferred embodiment of the present invention, the register (1740) is replaced with a 2 stage FIFO, the register (1741) is replaced with a 1 stage FIFO, the optional registers (1742) and (1743) are both replaced with a 1 stage FIFO, and the optional registers (1745) and (1747) are not used. In this case, the memory transfer request for each timeslot (for 1701, 1702, 1703, 1704) is loaded into its corresponding FIFO (1740, 1741, 1742, 1743). The concurrent output of each FIFO (1740, 1741, 1742, 1743) is delayed by 1 clock cycle for each delay register (1745, 1746, 1447) that is employed. In this illustration, only one delay register (1746) is employed, and so the output of each FIFO (1740, 1741, 1742, 1743) is released in parallel in the second timeslot. In this way a new memory transfer request can be issued every clock cycle in a round robin scheme with 4 timeslots, although it takes 5 clock cycles to transport each of those memory transfer requests to the 4 interconnect targets (1701, 1702, 1703, 1704).

In an alternate preferred embodiment of the present invention, the interconnect node (1705) is an interconnect target, and the interconnect nodes (1701, 1702, 1703, 1704) are interconnect masters. In this embodiment memory transfer requests are transported over the parallel-in, serial-out (PISO) M input port×1 output port shift register module (1707) and memory transfer responses are transported over the first serial-in, parallel-out (SIPO) 1 input port×M output port module (1708). Preferably each timeslot is 1 clock cycle in length, the interconnect masters (1701, 1702, 1703, 1704) are adapted to issue a memory transfer request once every 4 clock cycles and the interconnect target (1705) is adapted to receive a memory transfer request each clock cycle and issue a memory transfer response each clock cycle.

Preferably module (1707) is adapted to transporting just memory transfer requests and module (1708) is adapted to transport memory transfer responses along with a copy of their corresponding memory transfer requests to facilitate cache coherency for update-type snooping caches (1705, 1715, 1744, 1729, 1714.*s*, 1704).

FIG. 13 is a flow-chart (1800) illustrating the steps of interconnect master (1702) issuing a single memory transfer request over interconnect (1706) to interconnect target (1705) according to a preferred embodiment of the present invention. The process described in flow chart (1800) will not use the optional registers (1740, 1741, 1742, 1743, 1744, 1745, 1474), and the 4 memory transfer responses within a statically scheduled round-robin period of 4 clock cycles will not be buffered and released in parallel. In this way, only PISO module (1707) is implementing a timeslot based scheme, but the SIPO module (1708) employs a best-effort scheduling scheme.

In clock cycle 1 (1801):
In step 1820, the interconnect target (1705) receives the output of PISO module (1707) which contains an idle memory transfer request. The interconnect target (1720) generates an idle memory transfer response incorporating a copy of its corresponding idle memory transfer request. The value of that memory transfer response is supplied to interconnect (1708).

In step 1830, the value of the memory transfer response generated in step 1820 is received as input on port 1715.*i* and supplied to the input of the SIPO module (1708) and will be relayed across the 2 stages of that SIPO module. The first stage includes the modules (1725), (1726) and (1746). The second stage includes the modules (1727) and (1728). The interconnect arbiter and decoder module (1716) generates control signals on ports (1711.*e*), (1712.*e*), (1713.*e*), and (1714.*e*) granting the next ingress timeslot of the interconnect (1706) simultaneously to each of the interconnect masters (1701), (1702), (1703) and (1704) respectively.

In step 1810, the value of the control signal generated by the SIPO module (1707) in step 1830 is received as input by the interconnect master (1702).

In clock cycle 2 (1802):
In step 1821, the interconnect target (1705) receives the output of PISO module (1707) which contains an idle memory transfer request. The interconnect target (1720) generates an idle memory transfer response incorporating a copy of its corresponding idle memory transfer request which was received in step 1820. The value of that memory transfer response is supplied to the interconnect (1708).

In step 1811, the interconnect master (1702) generates a memory transfer request addressed to interconnect target (1705) the value of which is supplied to interconnect (1708).

In step 1831, the value of the memory transfer response generated in step 1821 is received as input to the SIPO module (1708) and will be relayed across the 2 stages of the SIPO module. The value of the memory transfer request generated in step 1811 is received as input to the second stage (1752) of the PISO module (1701) and stored in register (1730). Each of the other 3 interconnect nodes (1701), (1703), and (1704) generate an idle memory transfer response which is received as input to the first stage (1751), third stage (1753) and fourth stage (1754) respectively.

In clock cycle 3 (1803):
In step 1832, the value of the memory transfer request stored in register (1730) is released as output of the PISO module (1707) and supplied as input to the interconnect target (1705).

In step 1822, the interconnect target (1705) receives the output of PISO module (1707) which contains the value of the memory transfer request generated as output by the interconnect master (1702) in step 1811 and begins to processes that request. The interconnect target (1720) generates an idle memory transfer response incorporating a copy of its corresponding idle memory transfer request which was received in step 1821. The value of that memory transfer response is supplied to the interconnect (1708).

In step 1832, the value of the memory transfer response generated in step 1822 is received as input to the SIPO module (1708) and will be relayed across the 2 stages of the SIPO module.

In clock cycle 4 (1804):
In step 1823, the interconnect target (1705) receives the output of PISO module (1707) which contains an idle memory transfer request. The interconnect target (1720) generates a memory transfer response incorporating a copy of its corresponding idle memory transfer request which was received in step 1822. The value of that memory transfer response is supplied to the interconnect (1708).

In step 1833, the value of the memory transfer response generated in step 1823 is received as input to the SIPO module (1708) and will be relayed across the 2 stages of the SIPO module. That value of that memory transfer response received as input to the SIPO module (1708) is directly released as output over port (1712.*e*) to interconnect master (1702).

In step 1812, the interconnect master (1702) receives the value of the memory transfer response sent in step 1832 corresponding to the interconnect master's (1702) memory transfer request issued in step 1811.

In this way we have illustrated an interconnect master (1702) issuing a memory transfer request to interconnect target (1705) and receiving its corresponding memory transfer response over interconnect (1706).

Preferably, the shared memory computing architecture (1700) further comprises a second serial-in, parallel-out (SIPO) 1 input port×M output port (only port (1714.*s*) is illustrated) module (1709) for transporting cache coherency traffic, in which:

the input is connected to the ingress port (1715.*i*) of the singular port {1715.*i*, 1715.*e*} of the interconnect (1706); and the arbiter and decoder module (1716) controls the second SIPO 1×M module.

Preferably the first SIPO (1708) and second SIPO (1709) employ different routing policies. Let us consider an example where interconnect nodes (1701, 1702, 1703, 1704) are interconnect masters. In this example, the arbiter and decoder module (1716) selectively routes the value of each memory transfer response back to the interconnect master that issued the corresponding memory transfer request on the first SIPO (1708). However, for the second SIPO (1709), the arbiter and decoder module (1716) forwards the value of each and every memory transfer response (and its corresponding memory transfer request data) to the snoop port (only 1704.*s* illustrated) of all interconnect masters. See the description of FIG. 20 for an example encoding a memory transfer response with its corresponding memory transfer request. In this way the snooping of write memory transfer requests can be performed when monitoring just the interconnect transporting memory transfer responses. Preferably cache coherency groups are employed so that memory transfer responses (and their corresponding memory transfer request data) are selectively forwarded according to the cache coherency group policies in force on that interconnect (1706).

So in this way we have illustrated a bidirectional interconnect (1706) for transporting memory transfer requests and their corresponding memory transfer responses, comprising:

a unidirectional interconnect to transport memory transfer requests (1707);

a unidirectional interconnect to transport memory transfer responses (1708, 1709) which is adapted to transport memory transport responses that includes a copy of the corresponding memory transfer request.

In an alternate preferred embodiment, the interconnect node (1705) is an interconnect bridge. In some situations, it will be desirable for the interconnect bridge (1705) to operate as an interconnect protocol transcoding bridge in which the protocol to transcode is a bus interconnect protocol such as ARM AMBA AHB [2].

FIG. 14 is a block schematic diagram illustrating portions of a shared memory computing architecture (1900), employing embodiments of FIGS. 3 and 12 for preferred embodiments of the present invention. Shared memory computing architecture (1900) comprises:

- 16 interconnect masters (1901 to 1916);
- 1 interconnect target (1917);
- a composite interconnect {1960, 1961, 1962, 1963, 1964} comprising:
  - four sub-interconnects (1960, 1961, 1962, 1693) of the type described in FIG. 12, each sub-interconnect having 4 interconnect master ports ({1921 to 1924}, {1925 to 1928}, {1929 to 1932}, {1933 to 1936}) and 1 output port (1941, 1942, 1943, 1944);
  - one sub-interconnect (1964) having 4 input ports (1951 to 1954) and 1 interconnect target port (1955);
- in which:
  - the 4 interconnect masters (1901) to (1904) are connected to sub-interconnect (1960) on ports (1921) to (1924) respectively;
  - the 4 interconnect masters (1905) to (1908) are connected to sub-interconnect (1961) on ports (1925) to (1928) respectively;
  - the 4 interconnect masters (1909) to (1912) are connected to sub-interconnect (1962) on ports (1929) to (1932) respectively;
  - the 4 interconnect masters (1913) to (1916) are connected to sub-interconnect (1963) on ports (1933) to (1936) respectively;
  - the 4 output ports (1941, 1942, 1493, 1944) of the 4 sub-interconnects (1960, 1961, 1962, 1963) are connected to the 4 input ports (1951, 1952, 1953, 1954) of the sub-interconnect (1964) respectively;
  - the interconnect target (1917) is connected to sub-interconnect (1964) on port (1955);

Preferably, the composite interconnect {1960, 1961, 1962, 1963, 1964} employs a statically scheduled timeslot scheme with 16 timeslots, one for each of the interconnect masters (1901 to 1916).

In one preferred embodiment of the present invention, the arbiter and decoder modules of the five sub-interconnects (1960, 1961, 1962, 1963, 1964) are trivially substituted with a single arbiter and decoder module controlling the composite interconnect {1960, 1961, 1962, 1963, 1964}. In an alternate preferred embodiment of the present invention, the five arbiter and decoder modules in sub-interconnects (1960, 1961, 1962, 1963, 1964) are adapted to co-ordinate their activities to create a single logical finite state machine (not illustrated) controlling the composite interconnect {1960, 1961, 1962, 1963, 1964}.

FIG. 14 illustrates that different types of interconnects can be combined together to create a composite interconnect without a loss of generality.

In an alternate embodiment of the present invention, the interconnect nodes (1901 to 1916) are interconnect targets and the interconnect node (1917) is an interconnect bridge which permits one or more interconnect masters (not illustrated) to issue memory transfer requests over that interconnect bridge (1917) to the interconnect targets (1901 to 1916). Preferably the composite interconnect {1960, 1961, 1962, 1963, 1964} further comprises a means to enforce an access control policy between interconnect masters and interconnect targets. It is further preferred that the means to enforce an access control policy is adapted to ensure that no more than one interconnect master can issue memory transfer requests to a given interconnect target (1901 to 1916). In this way the access control policy guarantees that a memory transfer request to that interconnect target will not be delayed by other interconnect masters.

Figure 15:
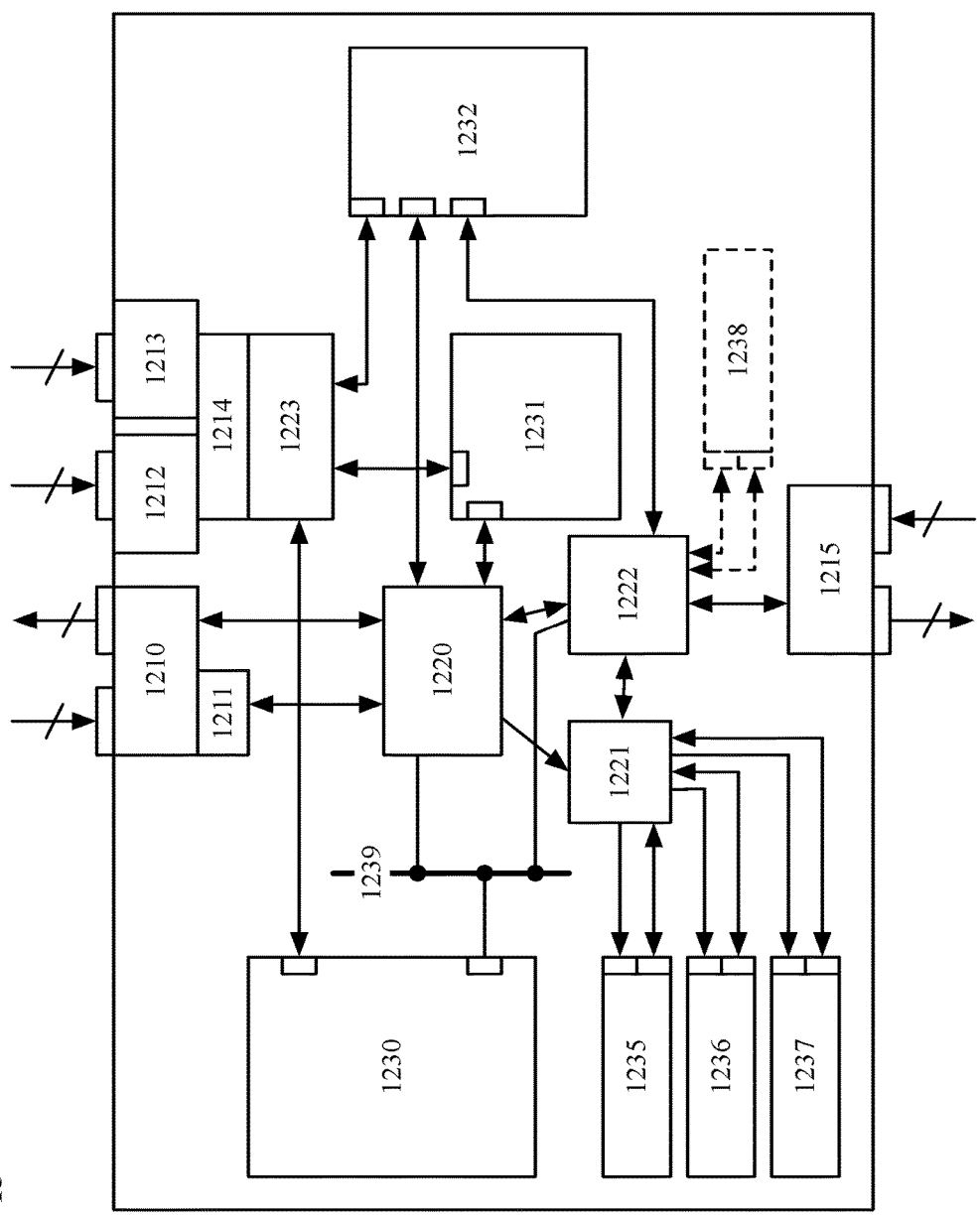
FIG. 15 is a high-level block schematic diagram illustrating a preferred embodiment of the present invention.

FIG. 15 is a high-level block schematic diagram illustrating a cache module (1200) for preferred embodiments of the present invention. Cache module (1200) comprises:

- an interconnect target port (1210);
- an interconnect master port (1215);
- two snoop ports (1212) and (1213);
- a first in first (FIFO) queue (1214) to store cache coherency being adapted to store snoop traffic received on the two snoop ports (1212) and (1213);
- a FIFO queue (1211) to store memory transfer requests received on the interconnect target port (1210) being adapted to store:
  - at least one outstanding write memory transfer request; and
  - at least one outstanding read memory transfer request;
- a dual-port cache-line store (1230) being adapted to store at least two cache-lines;
- a FIFO queue (1235) being adapted to queue write memory transfer events;
- a FIFO queue (1236) being adapted to queue read memory transfer events;
- a queue (1237) being adapted to queue the order to process read and write memory transfer events queued in the FIFO queues (1235) and (1236);
- a FIFO queue (1238) called a write buffer (1238) being adapted to store the data of cache-lines that have been evicted from the cache-line store (1320) and are to be written over the interconnect master port (1215);
- a dual port address tag finite state machine (1231) comprising:
  - a first target port;
  - a second target port;
  - a means to store tags that associate cache-lines stored in the cache-line store (1230) with their respective (virtual and/or physical) addresses;
  - a means to search for tags by their (virtual and/or physical address); and
  - a means to search for tags by their index within the cache-line store (1230);
- a triple port status tag finite state machine (1232) comprising:
  - a first target port:
  - a second target port;
  - a third target port;
  - a means to store tags that associate the cache-lines stored in the cache-line store (1230) with their status and other related information, including:
    - which cache-lines are allocated;
    - which cache-lines are in the process of being evicted;
    - optionally which cache-lines are in the process of being cleaned;
    - which portions of the cache-lines are valid; and
    - which portions of the cache-lines are dirty; and
  - a means to process commands received on the first, second and third target ports in a way that ensures internal consistency of the content of the tags and the responses to the concurrently issued commands;

an interconnect (1239) that is work preserving comprising:
- a high priority master port;
- a low priority master port; and
- a target port connected the second port of the dual-port cache-line store (1230);

a front-side FSM (1220) comprising:
- a master port connected to the low priority master port of the interconnect (1239);
- a bidirectional communications channel with the FIFO queue (1211);
- a bidirectional communications channel with the interconnect target port (1210);
- a unidirectional communications channel with the queuing FSM (1221);
- a bidirectional communications channel with the back-side FSM (1222);
- a master port connected to the second master port of the dual port address tag finite state machine (1231); and
- a master port connected to the second target port of the triple port status tag finite state machine (1232);

a queuing FSM (1221) comprising:
- a bidirectional communications channel with the front-side FSM (1220);
- a bidirectional communications channel with the back-side FSM (1222);
- two master ports connected to the FIFO queue (1235) being adapted to queue write memory transfer events;
- two master ports connected to the FIFO queue (1236) being adapted to queue read memory transfer events; and
- two master ports connected to the FIFO queue (1237) being adapted to queue the order to process read and write memory transfer events.

a back-side FSM (1222) comprising:
- a master port connected to the high priority master port of the interconnect (1239);
- a bidirectional communications channel with the queuing FSM (1221);
- a bidirectional communications channel with the front-side FSM (1220);
- a master port connected to the third target port of the triple port status tag finite state machine (1232);
- two master ports connected to the write buffer (1238); and
- a bidirectional communications channel with the interconnect master port (1215); and a snoop FSM (1223) comprising:
- a bidirectional communications channel with the FIFO queue (1214);
- a bidirectional communications channel with the back-side FSM (1222);
- a master port connected to the first target port of the dual port address tag finite state machine (1231);
- a master port connected to the first target port of the triple port status tag finite state machine (1232); and
- a master port connected to the first port of the dual-port cache-line store (1230).

Figure 16:
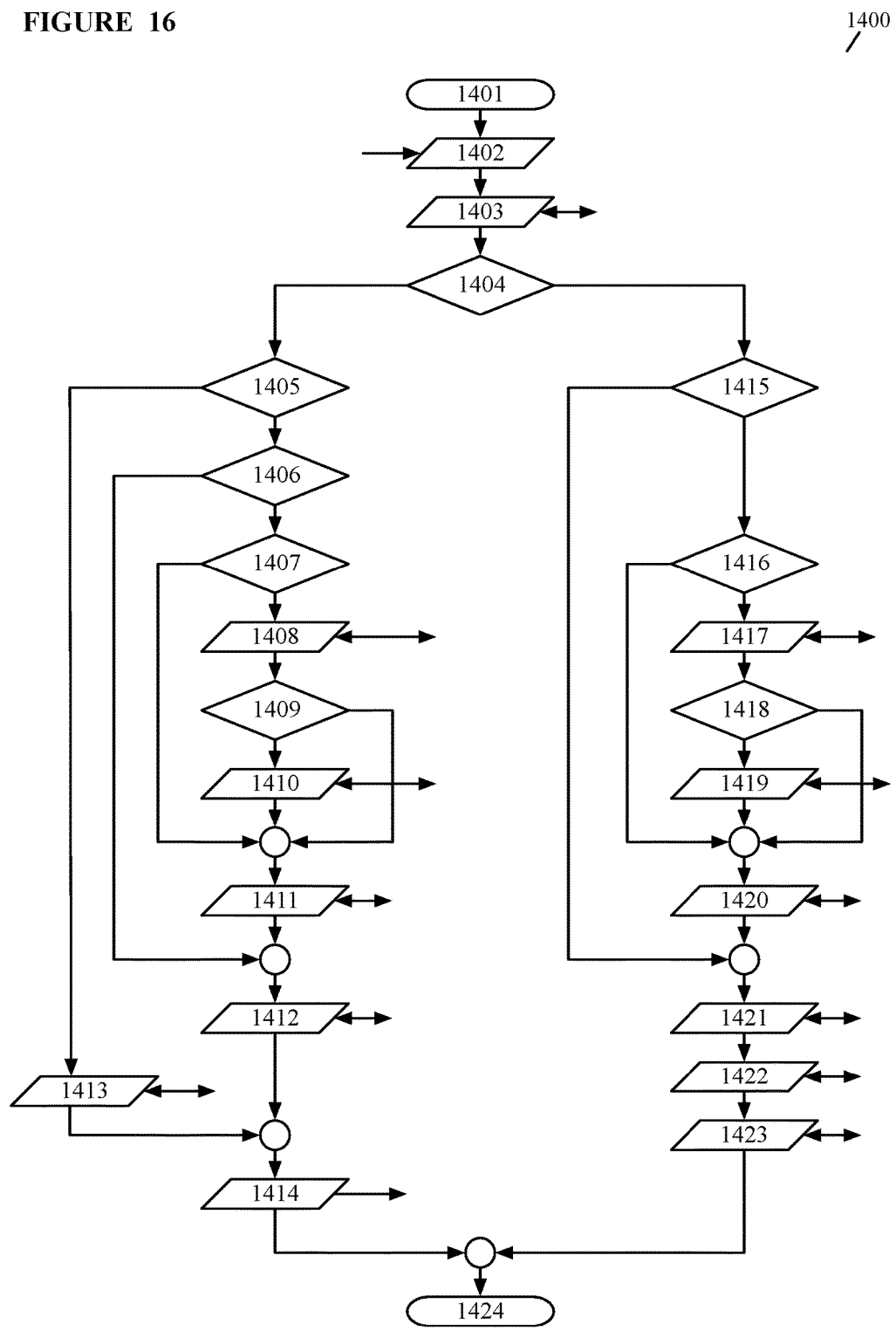
FIGS. 16 to 19 are flow-charts illustrating processes according to the embodiments of FIG. 15.

FIG. 16 is a flow-chart (1400) illustrating the steps of the front-side FSM (1220) of FIG. 15 according to a preferred embodiment of the present invention. The process described in flow chart (1400) is a functional description which executes over 1 or more clock cycles.

In step 1401, start the front-side FSM process.

In step 1402, perform a blocking read to fetch the next memory transfer request from the ingress FIFO queue (1211). By blocking, it is meant that the read request will wait until a memory transfer request is retrieved, even if the FIFO queue (1211) is initially empty when the read request is issued.

In step 1403, issue a blocking command to the address tag finite state machine (1321) to search for a cache-line by the address encoded in the memory transfer request received in step 1402. If the cache-line is present, then issue a blocking command to the status tag finite state machine (1322) to: (a) retrieve the status details including which portions of that cache-line are valid, (b) request the status details of the least recently used cache-line, and (c) ask if there are any currently unallocated cache-lines.

In step 1404, if the memory transfer request received in step 1402 is a read request go to step 1405 otherwise go to step 1415.

In step 1405, if the memory transfer request received in step 1402 corresponds to a cache-line that is present in the cache-line store (1230) and the requested content is present in that cache-line then go to step 1413 otherwise go to step 1406.

In step 1406, if the read memory transfer request received in step 1402 corresponds to a cache-line that is present in the cache-line store (1230) but a requested portion of that cache-line is not present/valid then go to step 1412 otherwise go to step 1407.

In step 1407, if there is at least one unallocated cache-line available in the cache-line store (1230), then go to step 1411, otherwise go to step 1408.

In step 1408, issue a non-blocking command to the status tag finite state machine (1232) marking the least recently used cache-line as being in the process of being evicted.

In step 1409, if the least recently used cache-line to be evicted is dirty and therefore must be written out of the cache module (1200) then go to step 1410, otherwise go to step 1411.

In step 1410, issue a non-blocking command to the queuing FSM (1221) requesting an eviction of the dirty cache-line. Wait for a notification from the back-side FSM (1222) indicating a write transaction has completed.

In step 1411, issue a blocking command to the status tag finite state machine (1232) requesting the allocation of an unallocated cache-line and receive the index for that newly allocated cache-line.

In step 1412, issue a non-blocking command to the queuing FSM (1221) to requesting a read memory transfer request, passing the index of the cache-line to store the retrieved data. Wait for the back-side FSM (1222): (a) to indicate that the cache-line has been read and stored in the cache-line store (1230), and (b) to forward a copy of the requested data to the front-side FSM.

In step 1413, issue a blocking command to the cache-line store (1230) to read a copy of the requested data and forward a copy of the requested data to the front-side FSM.

In step 1414, issue a memory transfer response containing the requested read data to the interconnect target port.

In step 1415, if the memory transfer request received in step 1402 corresponds to a cache-line that is present in the cache-line store (1230) then go to step 1421 otherwise go to step 1416.

In step 1416, if there is at least one unallocated cache-line available in the cache-line store (1230) then go to step 1420, otherwise go to step 1417.

In step 1417, issue a non-blocking command to the status tag finite state machine (1232) marking the least recently used cache-line as being in the process of being evicted.

In step 1418, if the least recently used cache-line to be evicted is dirty and therefore must be written out of the cache module (1200) then go to step 1419, otherwise go to step 1420.

In step 1419, issue a non-blocking command to the queuing FSM (1221) request an eviction of the dirty cache-line. Wait for a notification from the back-side FSM (1222) indicating that a write transaction has completed.

In step 1420, issue a blocking command to the status tag finite state machine (1232) requesting the allocation of an unallocated cache-line and receive the index to that newly allocated cache-line.

In step 1421, issue a non-blocking command to the cache-line store (1230) to write a copy of the data received in the write memory transfer request to the location in the cache-line store (1230) indicated by the index received in step 1420.

In step 1422, issue a non-blocking command to the status tag finite state machine (1232) marking that cache-line as being dirty.

In step 1423, if this cache-line was previously clean, issue a non-blocking command to the queuing FSM (1221) to inform it this cache-line is now dirty.

In step 1424, end the front-side FSM process.

In this way, we have demonstrated that the front-side FSM:
- employs an allocate on read strategy;
- employs an allocate on write strategy;
- employs a least recently used eviction strategy; and
- writes can be performed to any dirty cache-line which has been queued for eviction, but not yet evicted.

Figure 17:
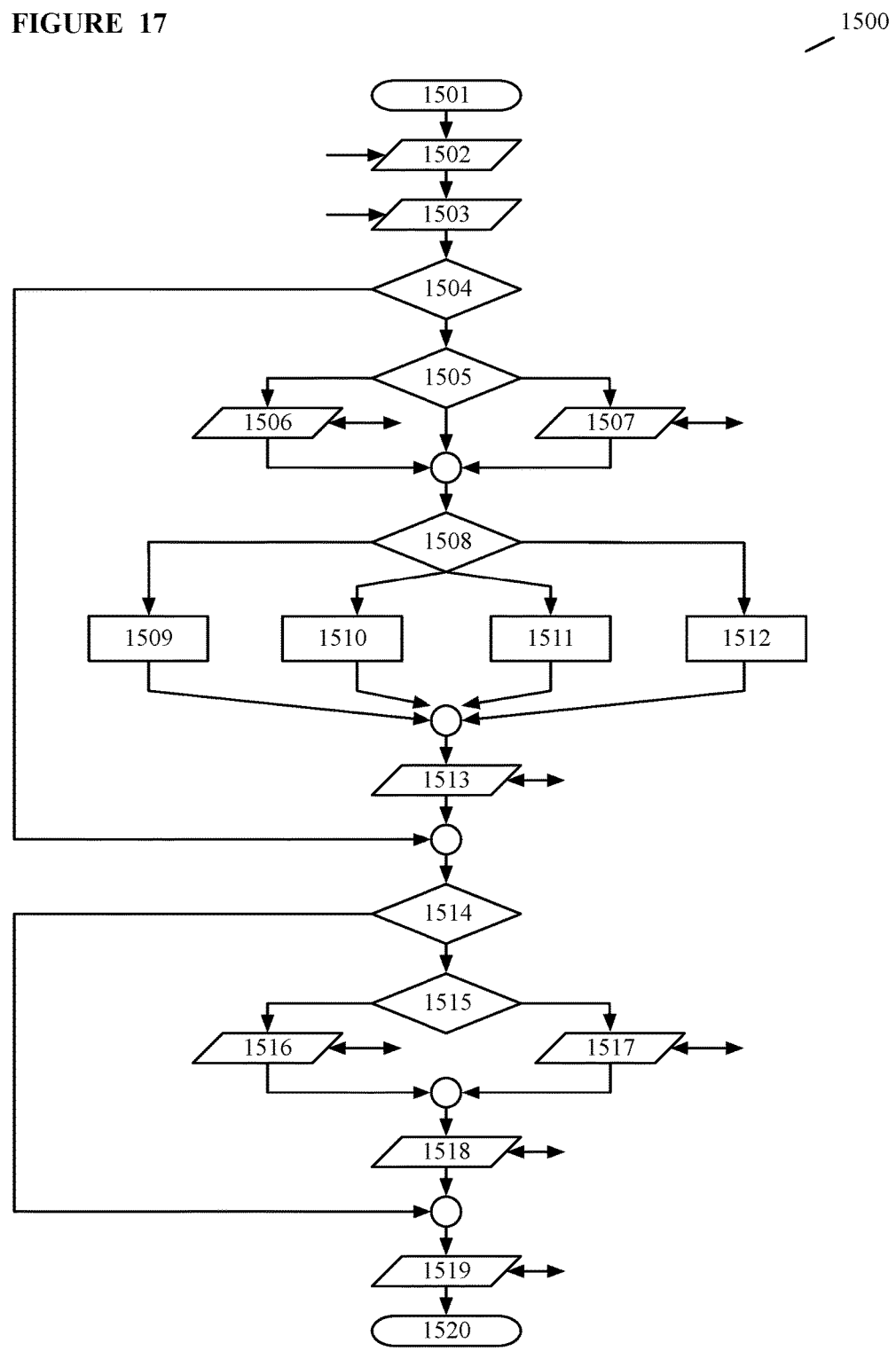

FIG. 17 is a flow-chart 1500 illustrating the steps of the queuing FSM (1221) of FIG. 15 according to a preferred embodiment of the present invention. The process described in flow chart (1400) is a functional description which executes every clock cycle that the cache module (1200) is enabled. At least one of the 4 policies is selected at power on, and the currently active policy can be changed at run time.

In step 1501, start the queuing FSM (1221) process.

In step 1502, receive any commands issued by the front FSM (1220);

In step 1503, receive any notifications issued by the back FSM (1222);

In step 1504, if there are no commands issued by the front FSM (1220) this clock cycle then go to step 1514, otherwise go to step 1505.

In step 1505, if a read command is received in step 1502, go to step 1506. If an eviction command is received in step 1502, go to step 1507. Otherwise a dirty cache-line notification command has been received in step 1502 therefore go to step 1508.

In step 1506, store the read command in FIFO queue (1236); go to step 1508.

In step 1507, store the write command in FIFO queue (1235); go to step 1508.

In step 1508, if the currently active policy is policy 1, go to step 1509. If the currently active policy is policy 2, go to step 1510. If the currently active policy is policy 3, go to step 1511. Otherwise the currently active policy is policy 4 therefore go to step 1512.

In step 1509, policy 1 employs a policy in which a cache-line is solely evicted in response to servicing a memory transfer request which either:
- flushes at least one specific cache-line; or
- requires the allocation of at least one cache-line.

Policy 1 ignores all dirty cache-line notification commands received in step 1502. In a preferred embodiment of the present invention, read and write operations will be queued in (1237) in the order they are received. In an alternate preferred embodiment of the present invention, read operations will take priority over queued write operations. Go to step 1513.

In step 1510, policy 2 employs a policy in which each cache-line is queued for eviction as soon as it becomes dirty and a read-miss is serviced after all the currently outstanding dirty cache-lines have been evicted.

If a dirty cache-line notification command was received in step 1502 then generate a write command and store it in the FIFO queue (1235) to queue writing this dirty cache-line out of the cache-module (1200). Go to step 1513.

In step 1511, policy 3 employs a policy in which each cache-line is queued for eviction as soon as it becomes dirty and a read-miss is serviced before all the currently outstanding dirty cache-lines have been evicted.

If a dirty cache-line notification command was received in step 1502 then generate a write command and store it in the FIFO queue (1235) to queue writing this dirty cache-line out of the cache-module (1200). Go to step 1513.

In step 1512, policy 4 employs a policy in which each cache-line is queued for eviction as soon as it becomes dirty; and in which a read-miss is serviced before the eviction of the currently outstanding dirty cache-lines queued for eviction on the condition that the execution time of each of the outstanding dirty-cache-lines evictions is not modified as a result of executing the read-miss operation first, otherwise the read-miss operation is delayed.

If a dirty cache-line notification command was received in step 1502 then generate a write command and store it in the FIFO queue (1235) to queue writing this dirty cache-line out of the cache-module (1200). Go to step 1513.

In step 1513, the content of the queue (1237) is updated according to the currently active policy.

In step 1514, if there are no transaction-completed notifications issued by the back FSM (1220) this clock cycle then go to step 1519, otherwise go to step 1515.

In step 1515, if the back FSM (1220) issued a read transaction completed notification go to step 1516, otherwise a write transaction completed notification has been issued and therefore go to step 1517.

In step 1516, remove one element from the FIFO queue (1236). Go to step 1518.

In step 1517, remove one element from the FIFO queue (1235). Go to step 1518.

In step 1518, remove one element from the queue (1237).

In step 1519, release a copy of the head-of-line values for queues (1236), (1235), (1237) as input to the back FSM (1222).

In step 1520, end the queuing FSM (1221) process.

Figure 18:
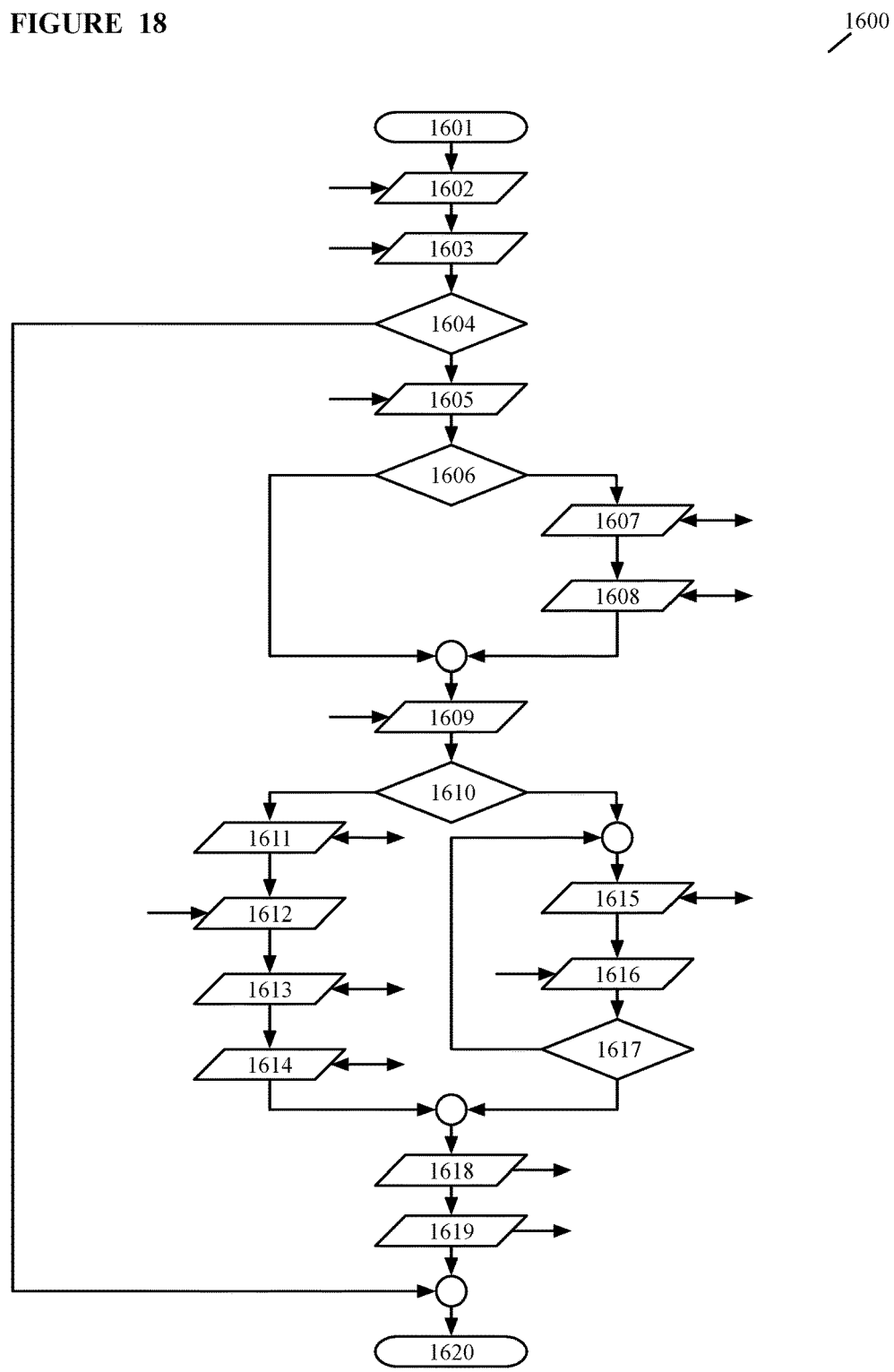

FIG. 18 is a flow-chart (1600) illustrating the steps of the back-side FSM (1222) of FIG. 15 according to a preferred embodiment of the present invention. The process described in flow chart (1600) is a functional description which executes over 1 or more clock cycles. This process assumes the interconnect connected to the cache modules' master interconnect port (1215) issues memory transfer responses to write memory transfer requests indicating if the transaction completed or needs to be resent because the transaction was corrupted before it could be completed.

In step 1601, start the back-side FSM (1222) process.

In step 1602, receive any commands issued by the front FSM (1220);

In step 1603, receive a copy of the head-of-line values for queues (1236), (1235), (1237) and store in variables R, W, and T respectively.

In step 1604, if there is no outstanding read memory transfer event R and no outstanding write memory transfer event T, then go to step 1620, otherwise go to step 1605.

In step 1605, issue a blocking request to the interconnect master interface requesting a timeslot on the interconnect (not illustrated). Preferably the interconnect (not illustrated) notifies the interconnect master port (1215) that it will be granted a timeslot on the interconnect at least one clock cycle before its allotted timeslot starts. The rest of this process assumes this is the case.

In step 1606 if the value of T indicates the read operation should be serviced go to step 1608 otherwise the write operation should be serviced therefore go to step 1607.

In step 1607, issue a blocking command to the cache-line store (1230) to read a copy of the requested data to write as per write memory transfer event W.

In step 1608, issue a non-blocking command to the status tag finite state machine (1232) updating the status of the cache-line as clean. Go to step 1609.

In step 1609, wait 1 clock cycle for the start of the memory transfer request timeslot on the interconnect (not illustrated).

In step 1610, if the value of T indicates the read operation should be serviced go to step 1611 otherwise the write operation should be serviced therefore go to step 1615.

In step 1611, create a read memory transfer request in response to the read memory transfer event R and issue that memory transfer request over the interconnect master port (1215).

In step 1612, wait until the memory transfer response to the read memory transfer request issued in step 1611 is received on interconnect master port (1215).

In step 1613, issue a non-blocking command to the cache-line store (1230) to write a copy of the data received in step 1612 using the cache-line index stored in the read memory transfer event R.

In step 1614, issue a non-blocking command to the status tag finite state machine (1232) updating the status of the portions of cache-line that are now valid. Go to step 1618.

In step 1615, create a write memory transfer request in response to the write memory transfer event W and issue that memory transfer request over the interconnect master port (1215).

In step 1616, wait until the memory transfer response to the write memory transfer request issued in step 1615 is received on interconnect master port 1215.

In step 1617, if the memory transfer response received in step 1616 request the write memory transfer request is present, go to step 1615 otherwise go to step 1618.

In step 1618, issue a transaction complete notification to the front FSM (1220) and a full copy of the memory transfer response.

In step 1619, issue a transaction complete notification to the queuing FSM (1221).

In step 1620, end the back-side FSM (1222) process.

In an alternate preferred embodiment of the present invention, the notification to the front side FSM (1220) and queuing FSM (1221) of the completion of a write memory transfer request which is currently performed in steps 1618 and 1619 can instead be performed in step 1608. This may permit the front side FSM (1220) to continue processing its current memory transfer request sooner.

Figure 19:
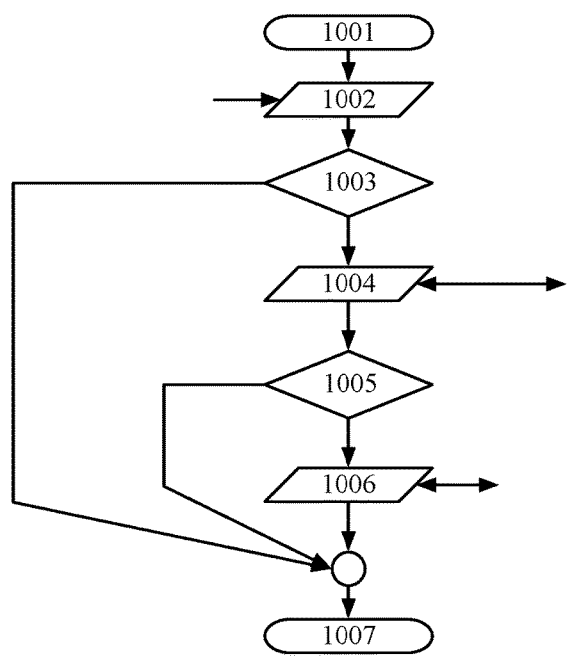

FIG. 19 is a flow-chart 1000 illustrating the steps of the snoop FSM (1223) of FIG. 15 according to a preferred embodiment of the present invention. The process described in flow chart (1000) is a functional description which executes over 1 or more clock cycles.

In step 1401, start the snoop FSM process.

In step 1002, perform a blocking read to fetch the next element of snoop traffic received on the two snoop ports (1212, 1213) from the FIFO queue (1214). In this embodiment snoop traffic is encoded as a copy of the memory transfer request and its corresponding memory transfer response. Preferably all snoop traffic is transported and stored using forward error correcting techniques. For example, the use of triple modular replication of all signals and registers, the use of error correcting codes, or the use of double modular redundancy on communications paths with time-shifted redundant transmission of messages with error checking codes.

In step 1003, if a read memory transfer request is received in step 1002, go to step 1008. If a successful write memory transfer request has been received go to step 1004. Otherwise go to step 1008. Preferably read memory transfer requests are not issued to the snoop ports (1212) and (1213).

In step 1004, issue a blocking command to the address tag finite state machine (1321) to search for the index of a cache-line by the address encoded in the memory transfer request received in step 1402.

In step 1005, if the cache-line is not present in the cache-line store (1230) then go to step 1008.

In step 1006, issue a blocking command to the cache-line store (1230) to write a copy of the data stored in the memory transfer request into the corresponding cache-line in the cache-line store (1230). In this embodiment we have avoided adjusting the status valid status flags to avoid introducing a modification of the execution time for memory transfer requests issued on the interference-target port (1210). This is the preferred mode of operation when the processor core is not fully timing compositional and suffers from timing anomalies.

In an alternate preferred embodiment of the present invention, a blocking command is issued to the status tag finite state machine (1232) to update which portions of the cache-lines are valid. This may accelerate the execution time of memory transfer requests issued on the interference-target port (1210) but may introduce additional complexity when performing worst case execution time analysis of software running on the core associated with this cache.

In step 1007, end the snoop FSM (1222) process.

The cache module of FIG. 15 is employed as:

the cache modules {733.*a*, 733.*b*}, {743.*a*, 743.*b*} of FIG. 6; and the cache modules {1351.*a*, 1352.*a*}, {1352.*a*, 1352.*b*} of FIG. 11.

In this way we have now described how the shared memory computing device of FIGS. 6 and 15 comprises:

N fully associative cache modules, where the value of N is at least 1, each fully associative cache module comprising:
  a master port:
  a target port;
  a means to track dirty cache-lines; and
  a finite state machine with one or more policies, in which at least one policy:
    employs an allocate on read strategy;
    employs an allocate on write strategy; and employs a least recently used eviction strategy; and
N processor cores, in which each core:
is assigned a different one of the N fully associative cache modules as its private cache.

The combined use of a fully-associative write-back cache modules with a least recently used eviction scheme as thus described is particularly well suited for upper-bound WCET analysis.

In contrast, set-associative write-back caches with any type of eviction scheme (a mode of operation found in a very large number of commercial computer architectures) is highly undesirable for upper-bound WCET analysis due to the interaction between: unknown effective addresses, the set-associative cache architecture, and the eviction of dirty cache-lines as a result of unknown effective addresses.

With unknown effective addresses, for example that may occur as a result of a data-dependent look up to an array that occupies more than one cache-line, it is not possible to statically determine exactly which set of the set-associative cache is accessed. As a result, upper-bound WCET analysis tools must make conservative assumptions about any one of the sets of the cache that could have been accessed by that unknown effective address. In a 4-way set-associative cache, this can lead to the pessimistic assumption by an upper-bound WCET analysis tool that a full 25% of the cache-lines in the cache store may not be present. In both write-through and write-back modes of operation, upper-bound WCET analysis tools work on the worst case assumption that none of those potentially evicted cache-lines will now be present and that a read memory transfer request to a cache-line that was present must be re-read. However in write back mode of operation, upper-bound WCET analysis tools must also make pessimistic assumptions about the write-back operations that may occur as a result of cache-lines that were dirty before the unknown effective addresses lookup. Furthermore, if the cache-lines are backed in SDRAM using an open-page mode of operation, those write-back operations may adjust which rows are open in that SDRAM and thus the timing of operations to that SDRAM. Consequently this combination of write back mode of operation with set-associative caches can result in quite pessimistic upper-bound WCET results when compared to write through mode operation with set-associative caches. The later being the most popular mode of operation for performing upper-bound WCET analysis today.

In contrast, a fully-associative cache with least recently used eviction scheme does not introduce any ambiguity as to which cache-line would be evicted on an unknown effective address. Using fully-associative caches with least recently used eviction schemes and write-back mode of operation as described above will tend to result in better upper-bound WCET analysis results when compared to set associative caches with write-through mode of operation, and fully-associative caches with least recently used eviction schemes and write-through mode of operation.

This technique can be used with some processor cores that do exhibit timing effects (such as the Freescale MPC755), although it is preferred that those cores do not exhibit timing effects.

Figure 20:
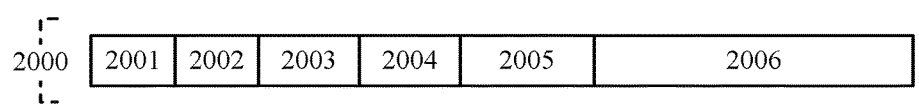
FIG. 20 is a diagram illustrating two sets of fields according to preferred embodiments of the present invention.
Figure 20:
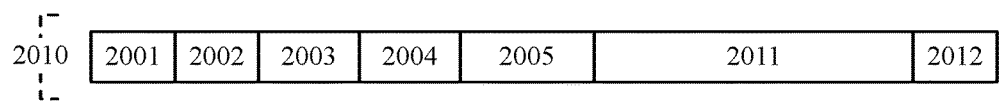

FIG. 20 is a diagram illustrating the fields 2020 of a memory transfer request (2000) and the fields of its corresponding memory transfer response (2010) which includes a copy of the corresponding memory transfer request (2010) according to a preferred embodiment of the present invention. In FIG. 20, the memory transfer request (2000) comprises:

an 8-bit field (2001) indicating uniquely identifier an interconnect-master within the computing architecture;
an 8-bit field (2002) indicating the transaction ID for that interconnect-master;
a 4-bit field (2003) indicating the transaction type, for example, a read or write memory transfer request type;
a 5-bit field (2004) used to indicate the size of the memory transfer request in bytes;
a 32-bit field (2005) used to indicate the address of the memory transfer request in bytes; and
a 256-bit field (2006) used to store the data to write for write memory transfer requests.

In FIG. 20, the memory transfer response (2010) comprises:
a copy of the memory transfer request, which comprises:
an 8-bit field (2001) indicating uniquely identifier an interconnect-master within the computing architecture;
an 8-bit field (2002) indicating the transaction ID for that interconnect-master;
a 4-bit field (2003) indicating the transaction type, for example, a read or write memory transfer request type;
a 5-bit field (2004) used to indicate the size of the memory transfer request in bytes;
a 32-bit field (2005) used to indicate the address of the memory transfer request in bytes;
a 256-bit field (2011) used to store the data to write for write memory transfer requests; and
a 4-bit response status field (2012).

The field (2011) is used to store the data read for read memory transfer requests. FIG. 20 illustrates that the memory transfer response has all the essential meta-data used in the original memory transfer request. In preferred embodiments, bus protocols do not use the transaction ID field (2002) if they do not employ transaction ID's.

Various embodiments of the invention may be embodied in many different forms, including computer program logic for use with a processor (eg., a microprocessor, microcontroller, digital signal processor, or general purpose computer), programmable logic for use with a programmable logic device (eg., a field programmable gate array (FPGA) or other PLD), discrete components, integrated circuitry (eg., an application specific integrated circuit (ASIC)), or any other means including any combination thereof. In an exemplary embodiment of the present invention, predominantly all of the communication between users and the server is implemented as a set of computer program instructions that is converted into a computer executable form, stored as such in a computer readable medium, and executed by a microprocessor under the control of an operating system.

Computer program logic implementing all or part of the functionality where described herein may be embodied in various forms, including a source code form, a computer executable form, and various intermediate forms (e.g., forms generated by an assembler, compiler, linker, or locater). Source code may include a series of computer program instructions implemented in any of various programming languages (e.g., an object code, an assembly language, or a high-level language such as ADA SPARK, Fortran, C, C++, JAVA, Ruby, or HTML) for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

The computer program may be fixed in any form (e.g., source code form, computer executable form, or an intermediate form) either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM or DVD-ROM), a PC card (e.g., PCMCIA card), or other memory device. The computer program may be fixed in any form in a signal that is transmittable to a computer using any of various communication technologies, including, but in no way limited to, analog technologies, digital technologies, optical technologies, wireless technologies (e.g., Bluetooth), networking technologies, and inter-networking technologies. The computer program may be distributed in any form as a removable storage medium with accompanying printed or electronic documentation (e.g., shrink wrapped software), preloaded with a computer system (e.g., on system ROM or fixed disk), or distributed from a server or electronic bulletin board over the communication system (e.g., the internet or world wide web).

Hardware logic (including programmable logic for use with a programmable logic device) implementing all or part of the functionality where described herein may be designed using traditional manual methods, or may be designed, captured, simulated, or documented electronically using various tools, such as computer aided design (CAD), a hardware description language (e.g., VHDL or AHDL), or a PLD programming language (e.g., PALASM, ABEL, or CUPL).

Programmable logic may be fixed either permanently or transitorily in a tangible storage medium, such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM or DVD-ROM), or other memory device. The programmable logic may be fixed in a signal that is transmittable to a computer using any of various communication technologies, including, but in no way limited to, analog technologies, digital technologies, optical technologies, wireless technologies (e.g., Bluetooth), networking technologies, and internetworking technologies. The programmable logic may be distributed as a removable storage medium with accompanying printed or electronic documentation (e.g., shrink wrapped software), preloaded with a computer system (e.g., on system ROM or fixed disk), or distributed from a server or electronic bulletin board over the communication system (e.g., the internet or world wide web).

Throughout this specification, the words "comprise", "comprised", "comprising" and "comprises" are to be taken to specify the presence of stated features, integers, steps or components but does not preclude the presence or addition of one or more other features, integers, steps, components or groups thereof.

REFERENCES

[1] G. Gebhard. Timing anomalies reloaded. In B. Lisper, editor, WCET, volume 15 of OASICS, pages 1-10. Schloss Dagstuhl—Leibniz-Zentrum fuer Informatik, Germany, 2010.

[2] ARM AMBA Specification (Rev 2.0), 1999. ARM IHI 0011A

[3] Aeroflex Gaisler. NGMP Specification, Next Generation Multi-Purpose Microprocessor. Report, European Space Agency, February 2010. Contract 22279/09/NL/JK. http://microelectronics.esa.int/ngmp/NGMP-SPEC-0001-i1r4.pdf

[4] F. J. Cazorla, R. Gioiosa, M. Fernandez, E. Quinones, M. Zulianello, and L. Fossati. Multicore OS Benchmark (for NGMP). Final report, Barcelona Supercomputing Centre, 2012. Under contract RFQ-3-13153/10/NL/JK. http://microelectronics.esa.int/ngmp/MulticoreOSBenchmark-FinalReport_v7.pdf

The invention claimed is:

1. A shared memory computing device comprising:
   a shared memory;
   an interconnect, in which that interconnect is adapted to arbitrate memory transfer requests issued from at least 2 master ports to the shared memory;
   N cache modules, where the value of N is at least 1, each cache module comprising:
      a target port;
      a master port that is adapted to issue memory transfer requests addressed to the shared memory that can be received by the interconnect; and
      means to implement an update-type cache coherency policy;
   M processor cores, where the value of M is equal to the value of N, in which each processor core is adapted to issue memory transfer requests that can be received on the target port of a different one of the N cache modules; and
   in which the memory access latency of non-atomic memory transfer requests issued by each of the M processor cores is not modified by:
      the memory transfer requests issued by any other of the at least 2 master ports.

2. A shared memory computing device as claimed in claim 1, in which the value of N is at least 2 and in which the memory access latency of non-atomic memory transfer requests issued by each of the M processor cores is not modified by the memory transfer requests issued by any of the other M processor cores.

3. A shared memory computing device as claimed in claim 2, in which at least one of the N cache modules is adapted to maintain coherency with regard to the data of the write memory transfer requests received on the target port of a different one of the N cache modules.

4. A shared memory computing device as claimed in claim 3, in which at least one of the N cache modules is adapted to maintain coherency with regard to the data of the write memory transfer requests issued by one of the at least two interconnect masters to a memory address located in the shared memory.

5. A shared memory computing device as claimed in claim 2, in which at least one of the N cache modules is adapted to maintain coherency with regard to the data of the write memory transfer requests issued by one of the at least two interconnect masters to a memory address located in the shared memory.

6. A shared memory computing device as claimed in claim 2, in which at least one of the N cache modules is a fully associated cache.

* * * * *